(12) United States Patent
Kato et al.

(10) Patent No.: US 11,107,853 B2
(45) Date of Patent: Aug. 31, 2021

(54) PHOTOELECTRIC CONVERSION APPARATUS

(71) Applicant: CANON KABUSHIKI KAISHA, Tokyo (JP)

(72) Inventors: Taro Kato, Tokyo (JP); Yoichiro Handa, Tokyo (JP); Hajime Ikeda, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/594,810

(22) Filed: Oct. 7, 2019

(65) Prior Publication Data

US 2020/0127037 A1   Apr. 23, 2020

(30) Foreign Application Priority Data

Oct. 19, 2018   (JP) .............................. JP2018-197687
Dec. 18, 2018   (JP) .............................. JP2018-236156

(51) Int. Cl.
*H01L 27/146*   (2006.01)

(52) U.S. Cl.
CPC .... *H01L 27/14649* (2013.01); *H01L 27/1463* (2013.01); *H01L 27/14621* (2013.01); *H01L 27/14627* (2013.01)

(58) Field of Classification Search
CPC ............................................... H01L 27/14649
See application file for complete search history.

(56) References Cited

U.S. PATENT DOCUMENTS

| 5,453,611 | A | 9/1995 | Oozu | |
|---|---|---|---|---|
| 2010/0220228 | A1* | 9/2010 | Otake | .................... H04N 5/332 348/311 |
| 2018/0182793 | A1 | 6/2018 | Inui | |
| 2018/0219040 | A1 | 8/2018 | Choi | |

FOREIGN PATENT DOCUMENTS

| JP | 2010-245100 A | 10/2010 |
|---|---|---|
| JP | 2014-204043 A | 10/2014 |

OTHER PUBLICATIONS

Wonjoo Kim et al.; "A 1.5Mpixel RGBZ CMOS Image Sensor for Simultaneous Color and Range Image Capture;" olid-State Circuits Conference Digest of Technical Papers (ISSCC), Session 22/Image Sensors/22.7, 2012 IEEE International, pp. 392-394.

* cited by examiner

*Primary Examiner* — William A Harriston
(74) *Attorney, Agent, or Firm* — Canon U.S.A., Inc. IP Division

(57) ABSTRACT

A photoelectric conversion apparatus includes a semiconductor substrate, first and second micro lenses, a first filter with a transmittance of infrared light, and a second filter with a transmittance of visible light. At least one photoelectric conversion portion disposed so as to overlap the first filter in a planar view and a plurality of photoelectric conversion portions disposed so as to overlap the second filter in the planar view each include a first semiconductor region and a second semiconductor region. An impurity concentration of at least a part of the second semiconductor region of the at least one photoelectric conversion portion is lower than an impurity concentration of a portion in the second semiconductor regions of the plurality of photoelectric conversion portions that is disposed at the same depth as the at least a part of the second semiconductor region.

20 Claims, 30 Drawing Sheets

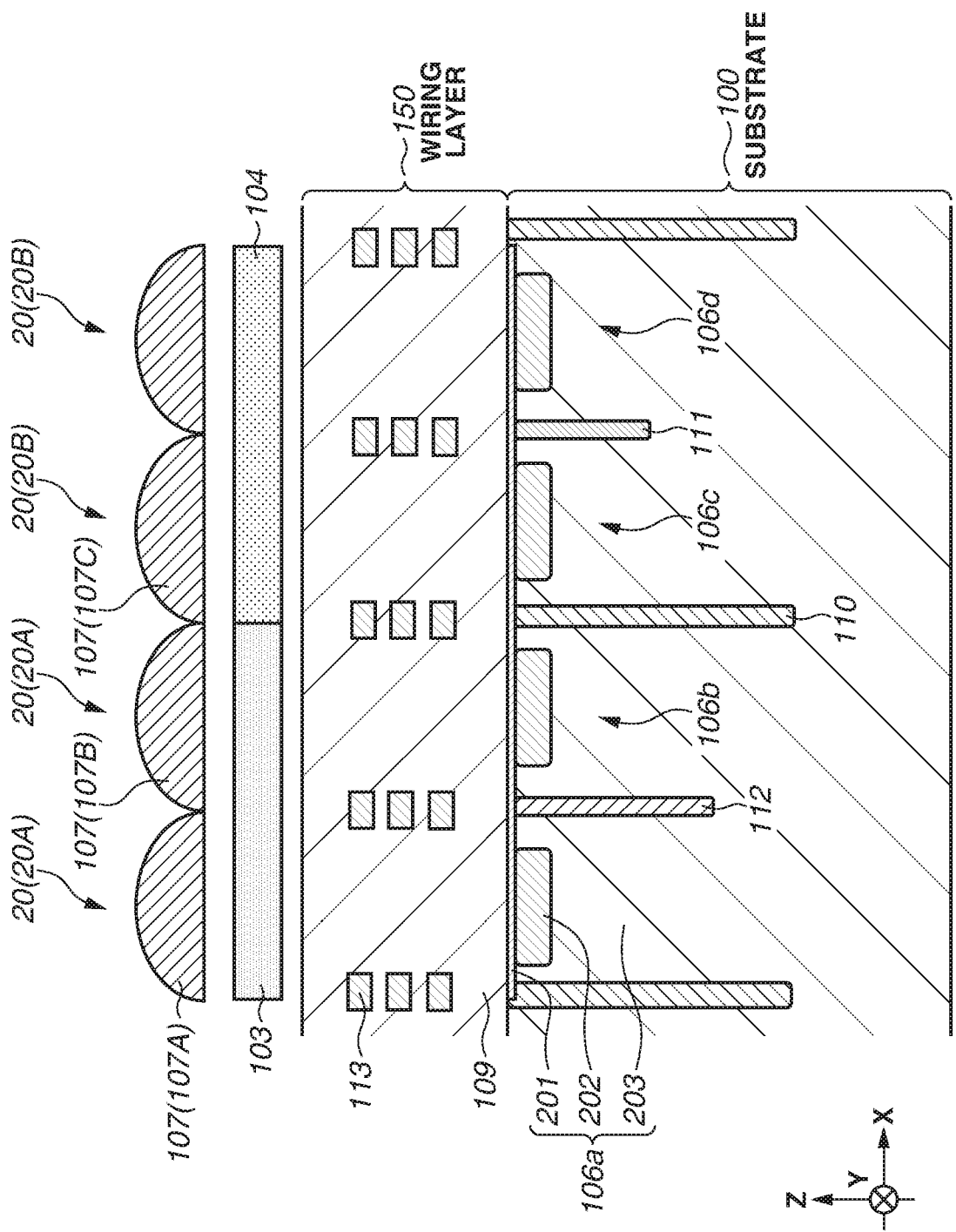

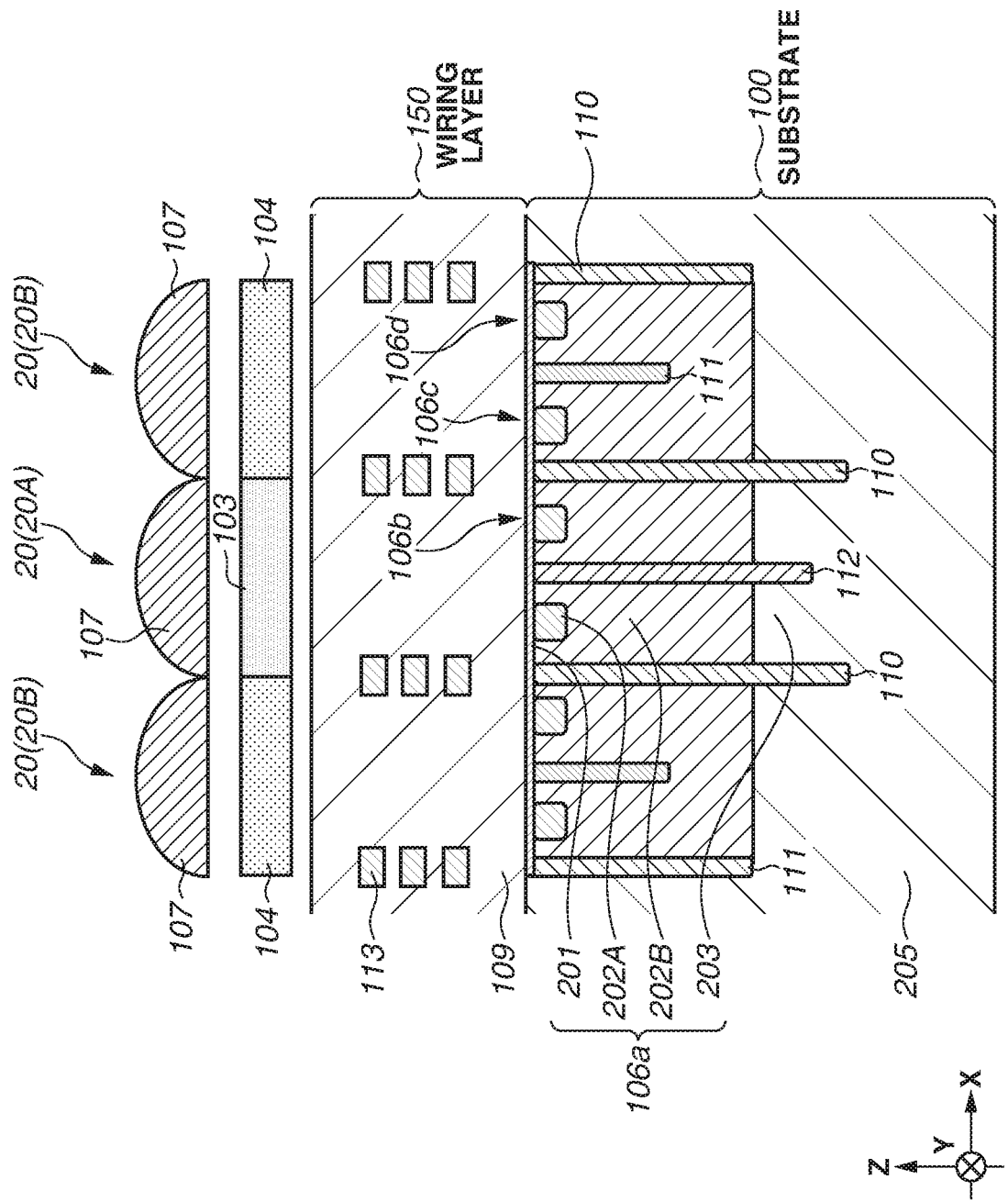

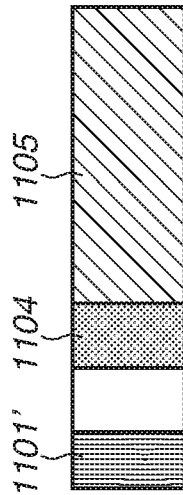
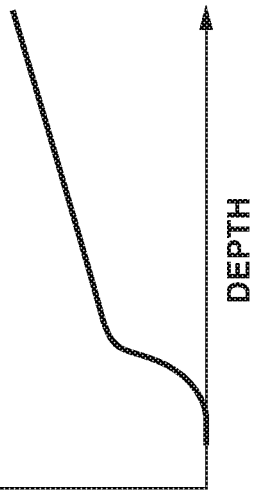
FIG.14A
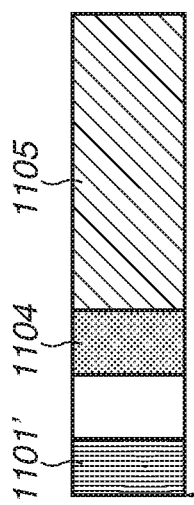
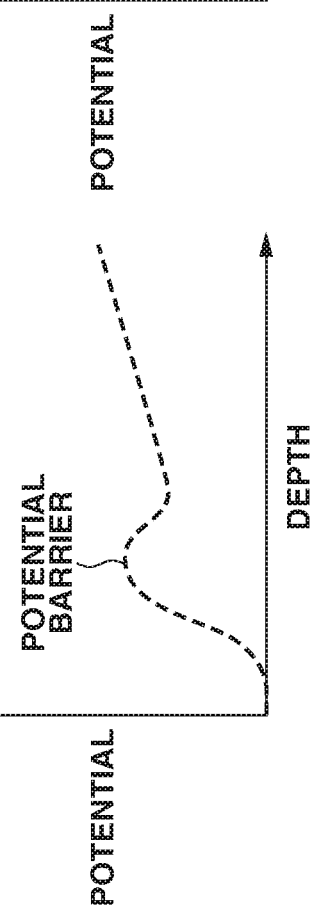
FIG.14B

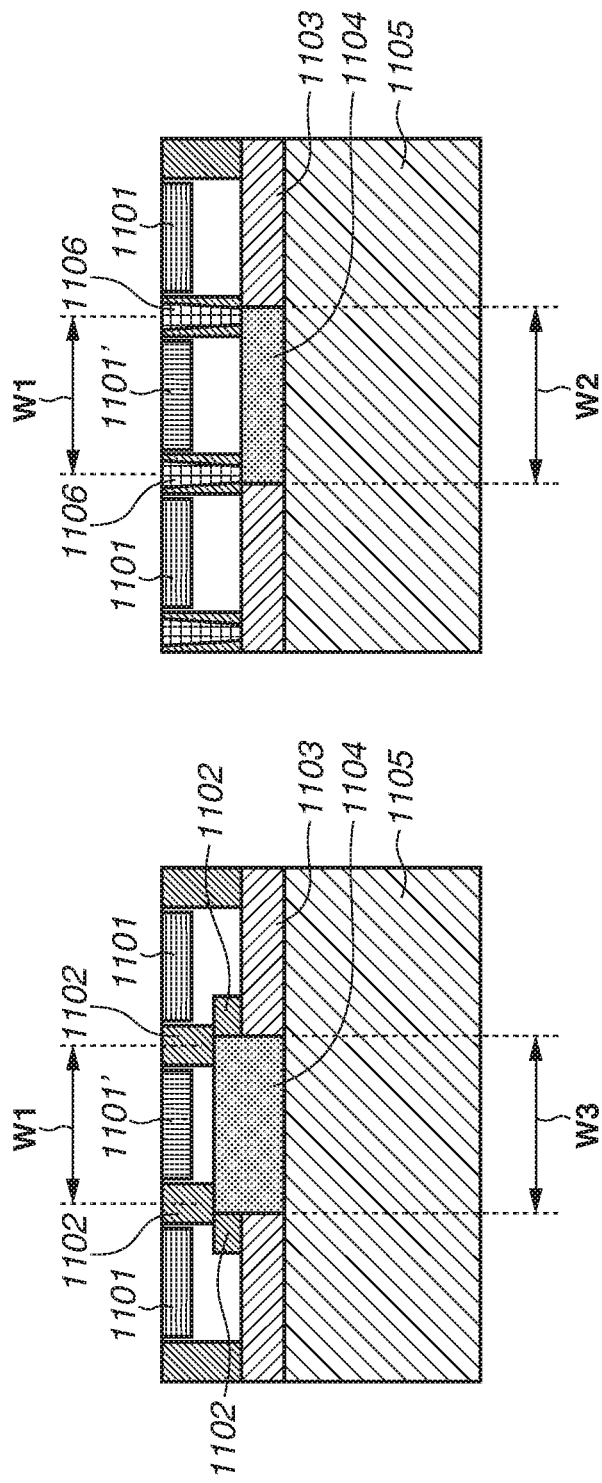

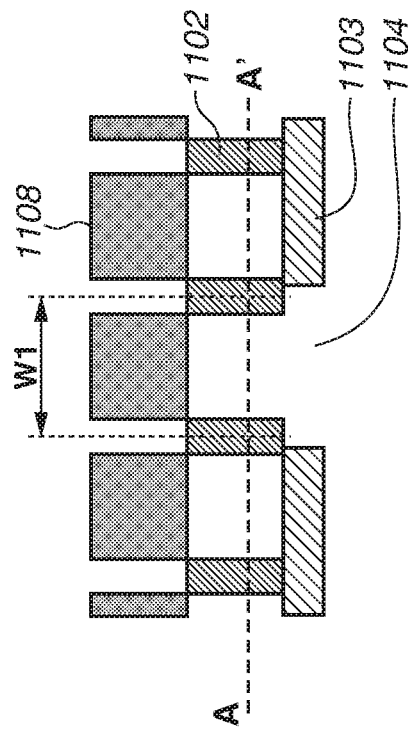
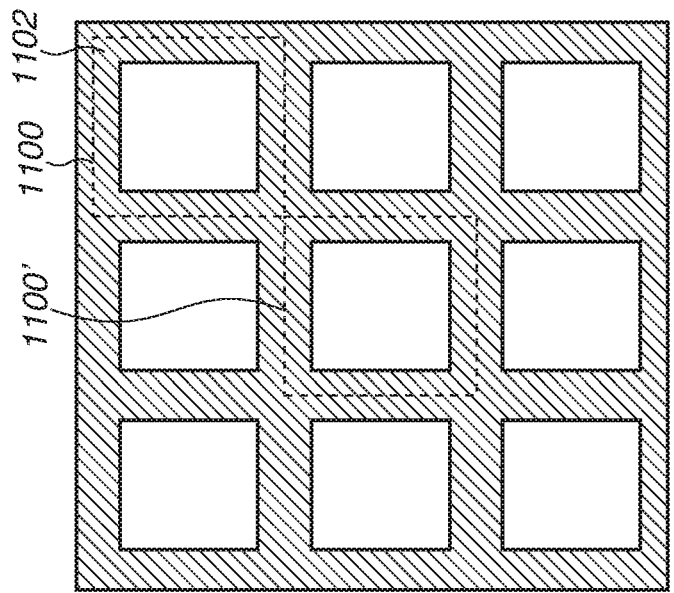
FIG. 18B
FIG. 18A

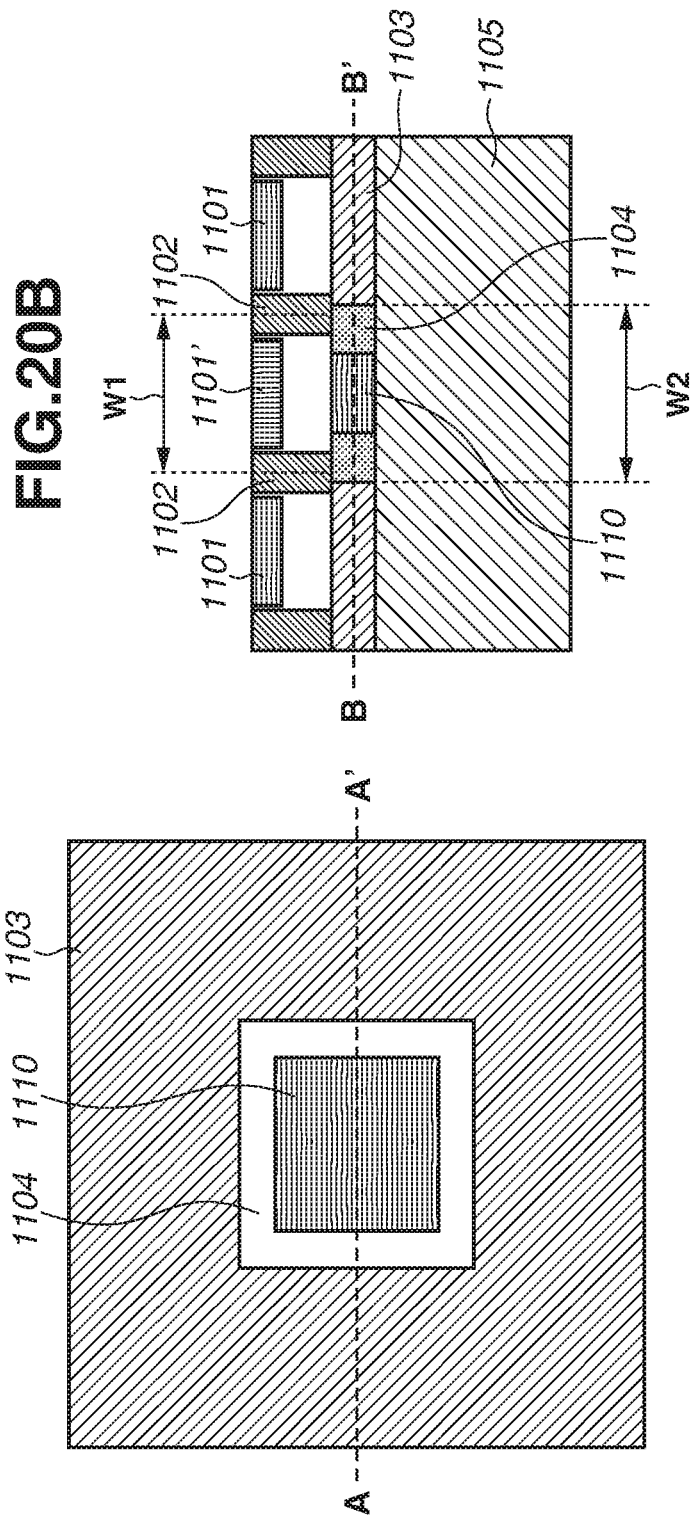

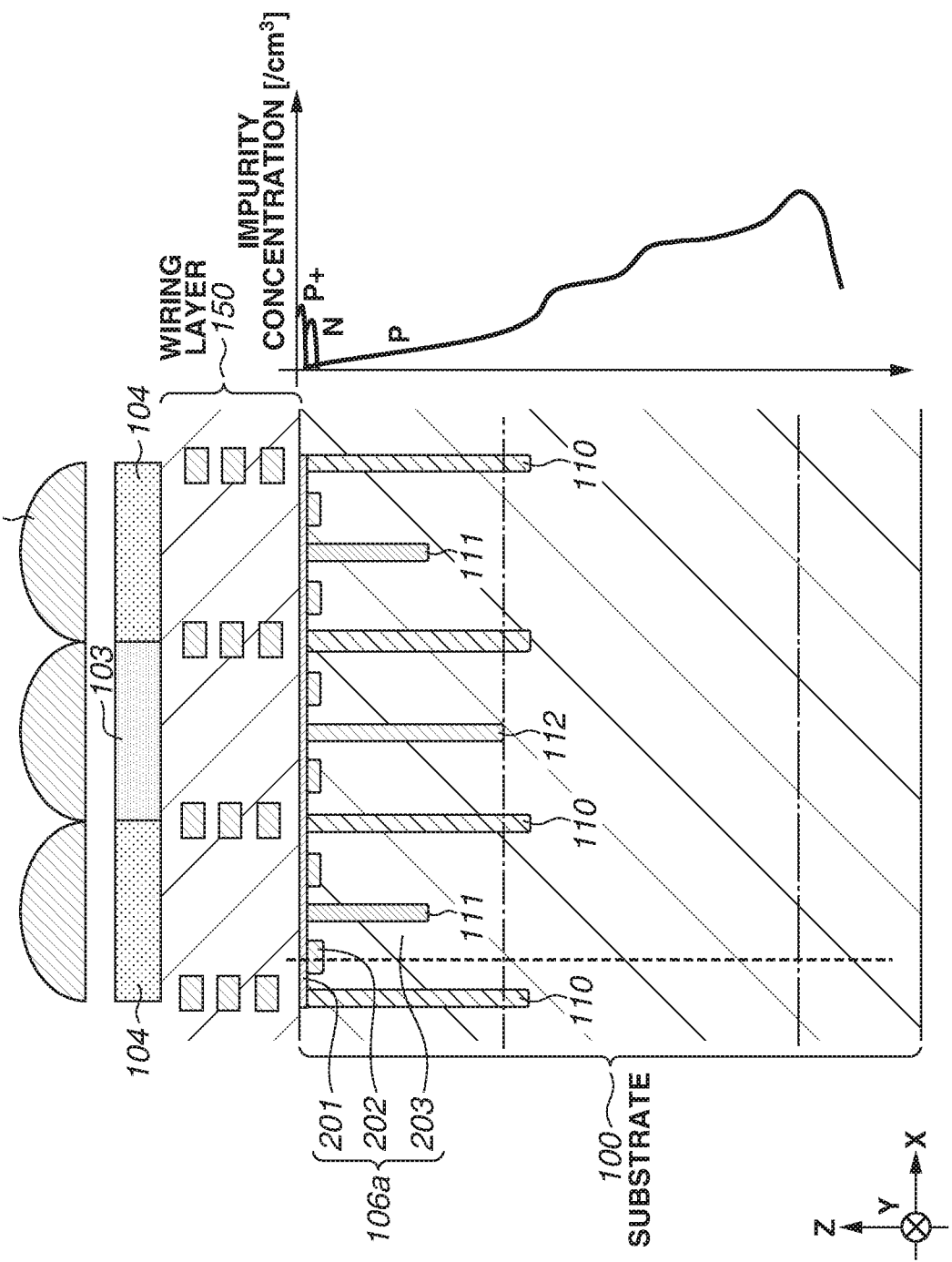

PHOTOELECTRIC CONVERSION APPARATUS

BACKGROUND

Field

The present disclosure relates to a photoelectric conversion apparatus.

Description of the Related Art

Conventionally, there has been known a photoelectric conversion apparatus including a filter permitting transmission of infrared light (hereinafter also referred to as "IR light") therethrough and a filter permitting transmission of visible light therethrough. United States Patent Publication Application No. 2018/219040 discloses the photoelectric conversion apparatus including the filter permitting the transmission of the IR light therethrough and the filter permitting the transmission of the visible light therethrough.

On the other hand, there has been known a photoelectric conversion apparatus causing a plurality of photoelectric conversion portions to share one micro lens thereamong. Japanese Patent Application Laid-Open No. 2014-204043 discloses a configuration in which the plurality of photoelectric conversion portions shares one micro lens thereamong, and the filter permitting the transmission of the visible light therethrough is disposed in correspondence with the plurality of photoelectric conversion portions. Japanese Patent Application Laid-Open No. 2014-204043 discloses that each of the photoelectric conversion portions includes a plurality of negative (N-type) semiconductor regions that collects signal charges, and a positive (p-type) semiconductor region for isolation is disposed between the N-type semiconductor regions.

United States Patent Publication Application No. 2018/219040 and Japanese Patent Application Laid-Open No. 2014-204043 leave room for improvement in a characteristic of the photoelectric conversion apparatus including the filter permitting the transmission of the IR light therethrough and the filter permitting the transmission of the visible light therethrough.

SUMMARY

The present disclosure is directed to improving the characteristic of the photoelectric conversion apparatus including the filter permitting the transmission of the IR light therethrough and the filter permitting the transmission of the visible light therethrough.

According to an aspect of the present disclosure, a photoelectric conversion apparatus includes a semiconductor substrate, first and second micro lenses, and first and second filters. The semiconductor substrate includes a plurality of photoelectric conversion portions. On the first filter, a transmittance of infrared light is higher than a transmittance of visible light. On the second filter, the transmittance of the visible light is higher than the transmittance of the infrared light. The plurality of photoelectric conversion portions includes at least one photoelectric conversion portion disposed so as to overlap the first micro lens and the first filter in a planar view, and a plurality of photoelectric conversion portions disposed so as to overlap the second micro lens and the second filter in the planar view. The at least one photoelectric conversion portion disposed so as to overlap the first filter in the planar view and the plurality of photoelectric conversion portions disposed so as to overlap the second filter in the planar view each include a first semiconductor region having a first conductivity type in which a signal charge is accumulated, and a second semiconductor region having a second conductivity type, which is an opposite conductivity type of the first conductivity type. The second semiconductor region is disposed on an opposite side of a side of the first filter of the first semiconductor region and disposed so as to overlap the first semiconductor region in the planar view. The second semiconductor region forms a p-n junction together with the first semiconductor region. An impurity concentration of at least a part of the second semiconductor region of the at least one photoelectric conversion portion is lower than an impurity concentration of a portion in the second semiconductor regions of the plurality of photoelectric conversion portions that is disposed at the same depth as the at least a part of the second semiconductor region.

According to another aspect of the present disclosure, a photoelectric conversion apparatus includes a semiconductor substrate and first, second, third, and fourth filters. The semiconductor substrate includes a plurality of photoelectric conversion portions. On the first and second filters, a transmittance of infrared light is higher than a transmittance of visible light. On the third and fourth filters, the transmittance of the visible light is higher than the transmittance of the infrared light. A photoelectric conversion portion disposed so as to overlap the first filter in a planar view, a photoelectric conversion portion disposed so as to overlap the second filter in the planar view, a photoelectric conversion portion disposed so as to overlap the third filter in the planar view, and a photoelectric conversion portion disposed so as to overlap the fourth filter in the planar view are arranged adjacently to one another in one direction. The photoelectric conversion portion disposed so as to overlap the first filter in the planar view includes a first semiconductor region having a first conductivity type in which a signal charge is accumulated. The photoelectric conversion portion disposed so as to overlap the second filter in the planar view includes a second semiconductor region having the first conductivity type. The photoelectric conversion portion disposed so as to overlap the third filter in the planar view includes a third semiconductor region having the first conductivity type. The photoelectric conversion portion disposed so as to overlap the fourth filter in the planar view includes a fourth semiconductor region having the first conductivity type. A fifth semiconductor region having a second conductivity type, which is an opposite conductivity type of the first conductivity type, is disposed between the second semiconductor region and the third semiconductor region. A sixth semiconductor region having the second conductivity type is disposed between the first semiconductor region and the second semiconductor region. A seventh semiconductor region having the second conductivity type is disposed between the third semiconductor region and the fourth semiconductor region. Each of the fifth semiconductor region, the sixth semiconductor region, and the seventh semiconductor region includes at least one peak of an impurity concentration. A position of a peak separated farthest away from a surface of the semiconductor substrate on a first filter side, among peaks that the sixth semiconductor region has, is separated farther away from the surface of the semiconductor substrate on the first filter side than a position of a peak separated farthest away from the surface of the semiconductor substrate on the first filter side, among peaks that the seventh semiconductor region has. A position of a peak separated farthest away from the surface of the semiconductor substrate on the first filter side, among peaks that the fifth semiconductor region has, is separated farther away from the surface of the semiconductor substrate on the first filter side than the position of the peak separated farthest away from the surface of the semiconductor substrate on the first filter side, among the peaks that the sixth semiconductor region has.

Further features of the present disclosure will become apparent from the following description of exemplary embodiments with reference to the attached drawings.

BRIEF DESCRIPTION OF THE DRAWINGS

FIG. 5 is a cross-sectional view of a part of a pixel region according to an exemplary modification of the first exemplary embodiment.

FIG. 6 is a cross-sectional view of a part of a pixel region according to an exemplary modification of the first exemplary embodiment.

FIGS. 14A and 14B are diagrams each illustrating a potential in the photoelectric conversion apparatus according to the fourth exemplary embodiment.

FIGS. 15A and 15B are cross-sectional views of another photoelectric conversion apparatus according to the fourth exemplary embodiment.

FIGS. 18A and 18B are diagrams illustrating the method for manufacturing the photoelectric conversion apparatus according to the fourth exemplary embodiment.

FIGS. 20A and 20B are a plan view and a cross-sectional view, respectively, of a photoelectric conversion apparatus according to a fifth exemplary embodiment.

FIG. 22 is a cross-sectional view of a part of a pixel region according to a seventh exemplary embodiment.

DESCRIPTION OF THE EMBODIMENTS

Exemplary embodiments for implementing the present disclosure will be described below with reference to the drawings. The exemplary embodiments that will be described below are intended to embody a technical idea of the present disclosure and are not intended to limit the present disclosure thereto. A size, a positional relationship, and the like of a member illustrated in each of the drawings may be exaggerated to make a description clear.

The exemplary embodiments will be described below on an assumption that a first polarity and a second polarity are a negative polarity and a positive polarity, respectively. However, similar effects can also be acquired when the first polarity and the second polarity are the positive polarity and the negative polarity, respectively. For convenience of description, a light reception surface side of a semiconductor substrate 100 (hereinafter also referred to as a "substrate 100") is defined as an upper side, and a surface side opposite to the light reception surface of the substrate 100 is defined as a lower side.

The exemplary embodiments will be described based on an example using an electron as a signal charge. In the exemplary embodiments, a negative (N-type) semiconductor region corresponds to a semiconductor region having a first conductivity type in which carriers having a first polarity serve as majority carriers, and a positive (p-type) semiconductor region corresponds to a semiconductor region having a second conductivity type in which carriers having a second polarity serve as majority carriers. However, the exemplary embodiments are also applicable to a case where a hole is used as the signal charge. In this case, the N type and the p-type are reversed.

Figure 1:
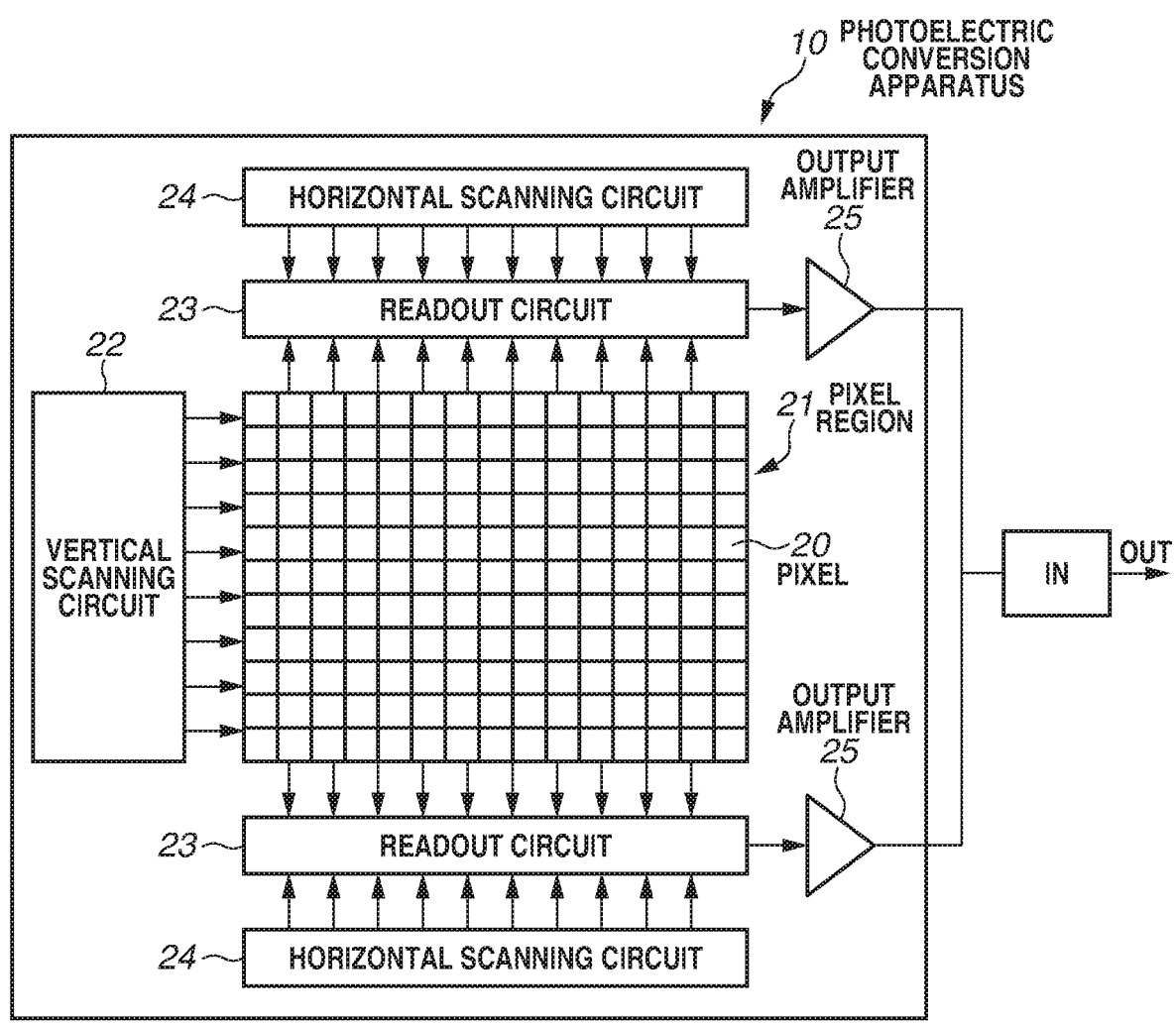
FIG. 1 is a block diagram illustrating a photoelectric conversion apparatus according to a first exemplary embodiment.
Figure 2:
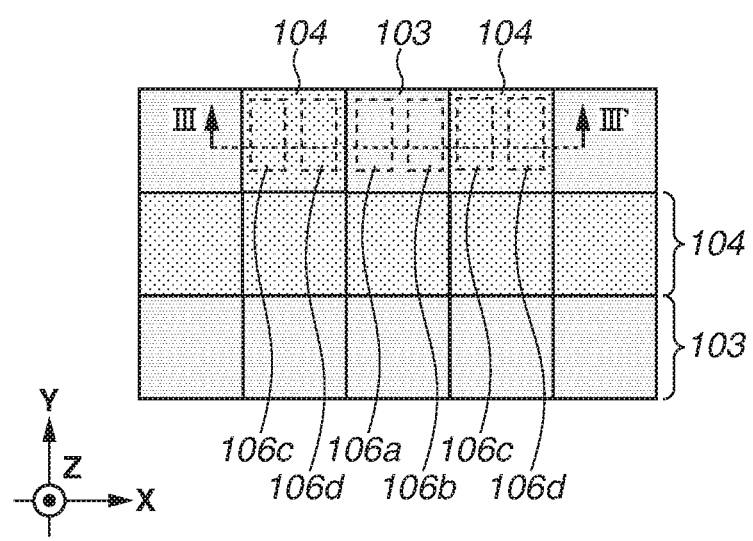
FIG. 2 is a diagram illustrating a layout of color filters in a part of a pixel region according to the first exemplary embodiment.
Figure 3:
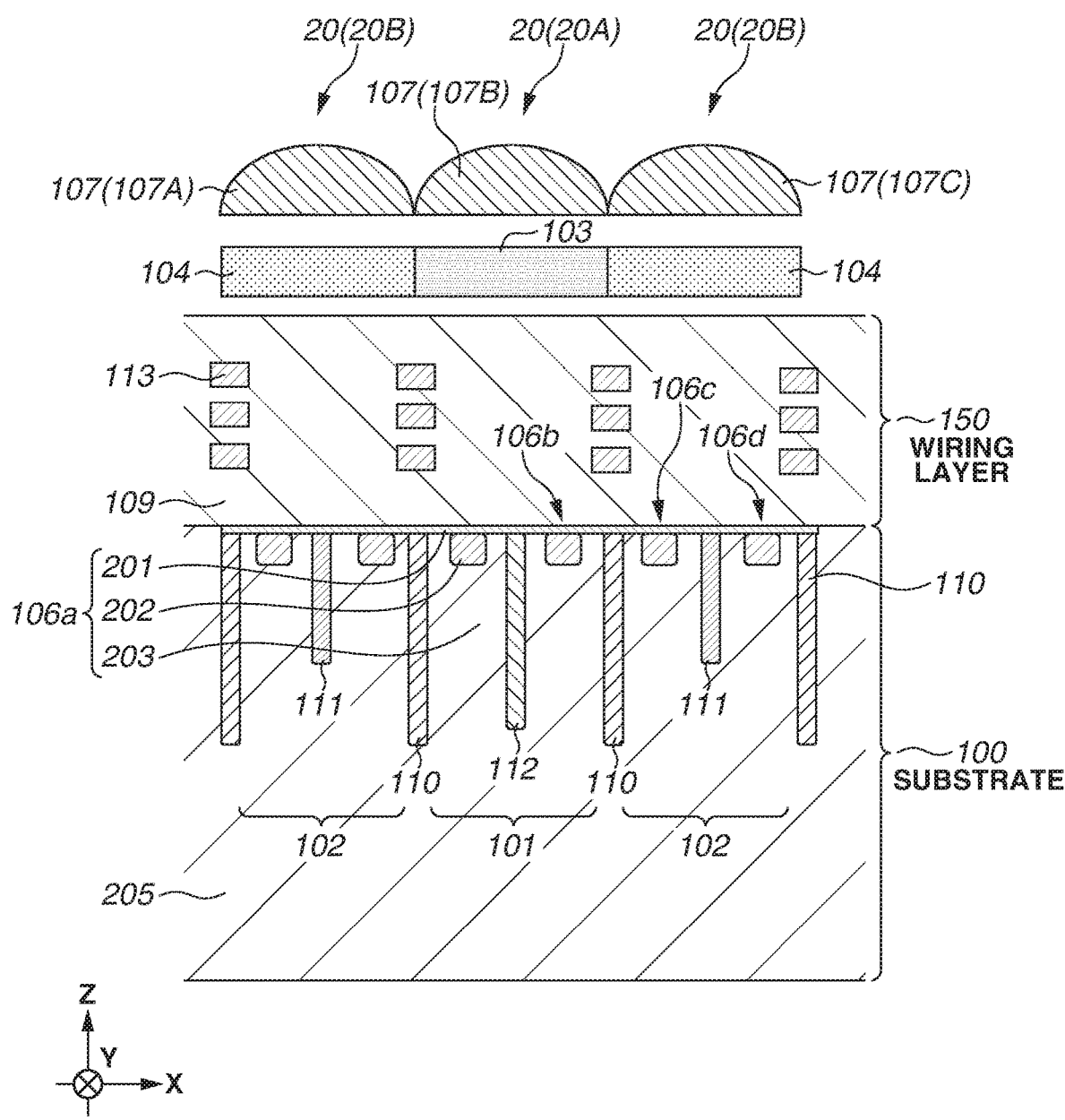
FIG. 3 is a cross-sectional view taken along a line III-HP illustrated in FIG. 2.
Figure 4:
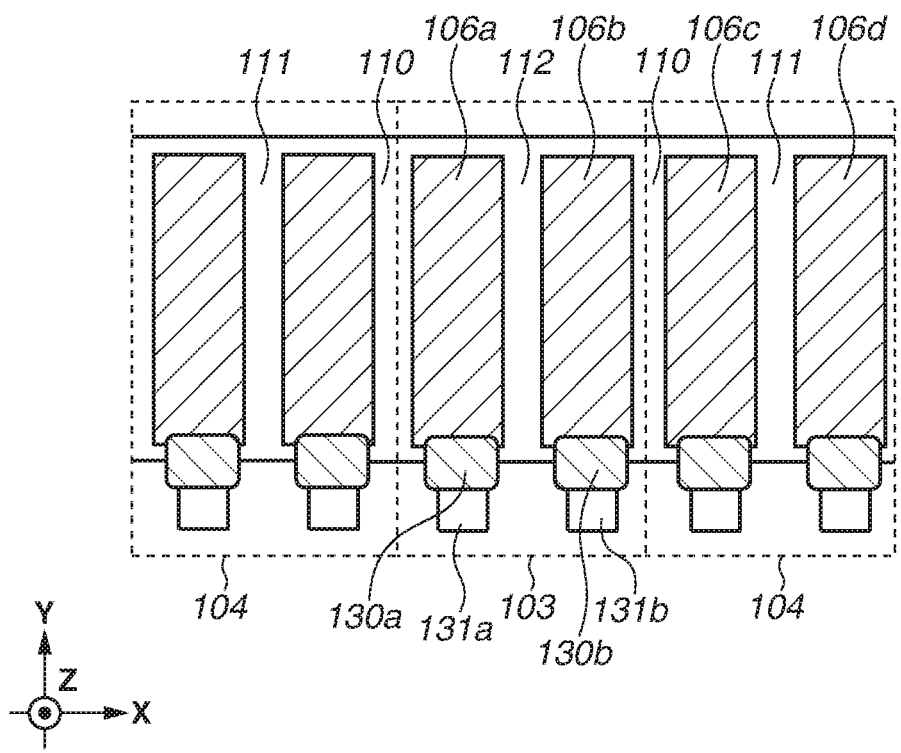
FIG. 4 is a diagram illustrating a substrate in FIG. 3 in a planar view.

A photoelectric conversion apparatus 10 according to a first exemplary embodiment will be described with reference to FIGS. 1 to 4. FIG. 1 is a block diagram illustrating the photoelectric conversion apparatus 10. FIG. 2 is a diagram illustrating a layout of color filters in a part of a pixel region included in the photoelectric conversion apparatus 10. FIG. 3 is a cross-sectional view taken along a line illustrated in FIG. 2. FIG. 4 is a planar view of the substrate 100.

As illustrated in FIG. 1, the photoelectric conversion apparatus 10 includes a pixel region 21 in which a plurality of pixels 20 is laid out in a row direction and a column direction. Herein, the region in which the plurality of pixels 20 is laid out is referred to as the pixel region 21, and the other region excluding the pixel region 21 is referred to as a peripheral circuit region.

First, the pixel region 21 illustrated in FIG. 1 will be described. FIG. 2 illustrates one example of the layout of the color filters included in the pixel region 21. Color filters 103 and 104 shown in FIG. 2 are made from, for example, dye or pigment.

Figure 29A:
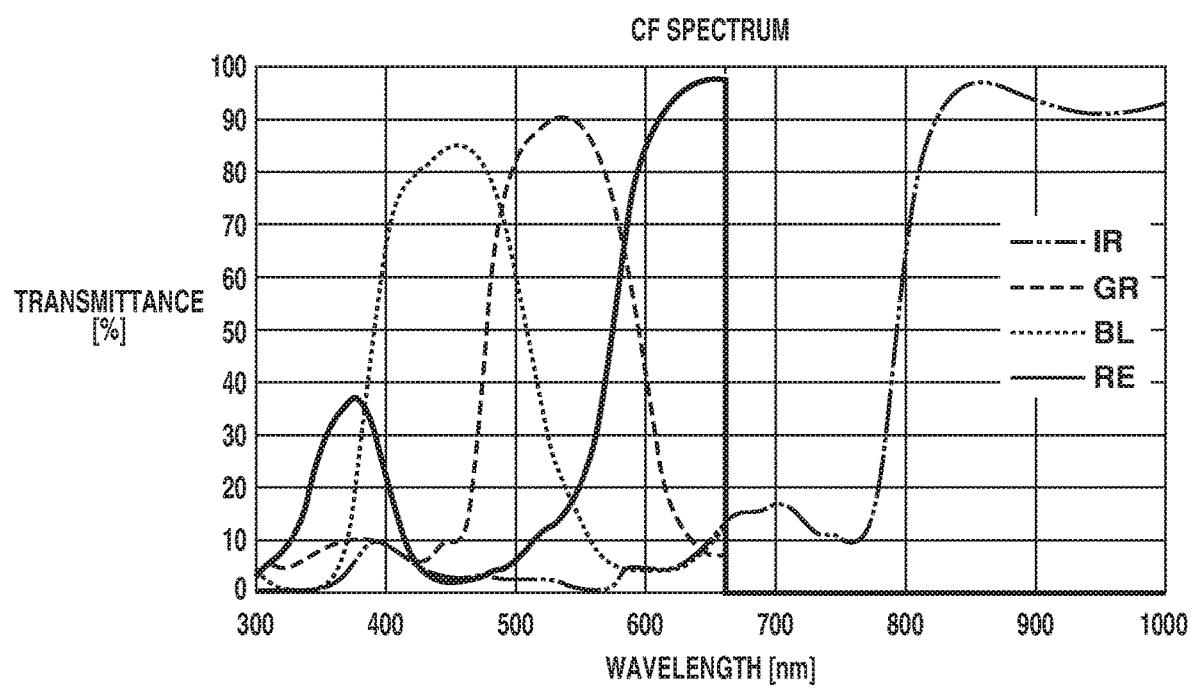
FIG. 29A is a graph indicating transmittances of the color filters.
Figure 29B:
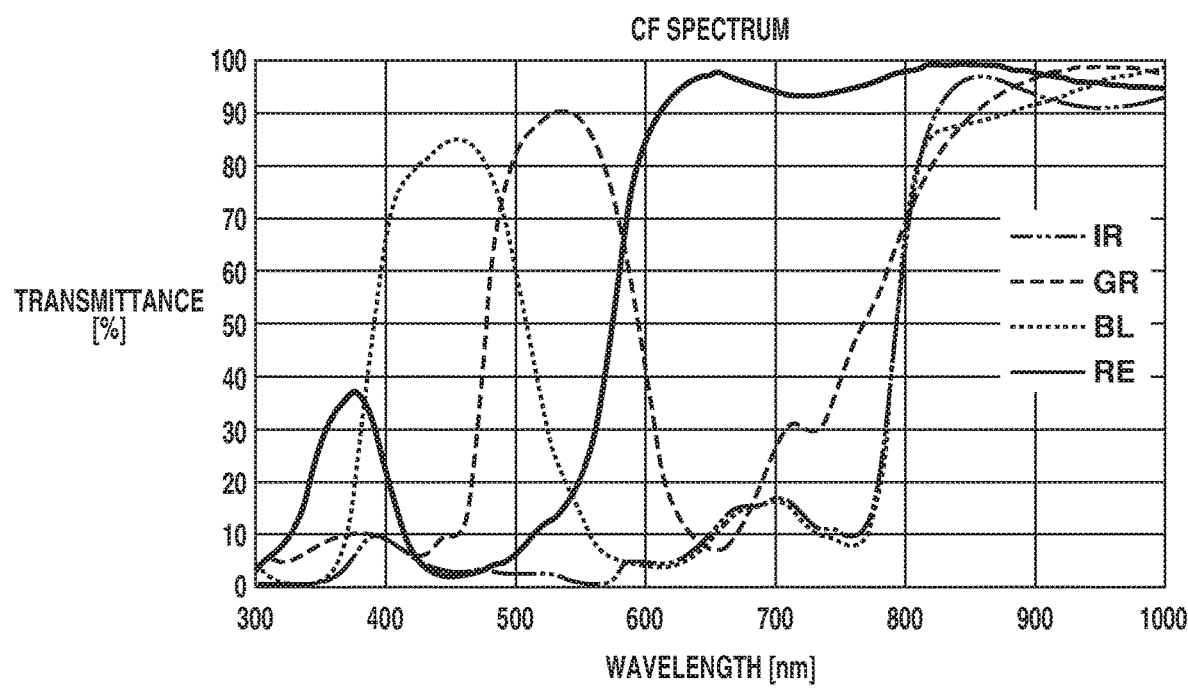
FIG. 29B is a graph indicating the transmittances of the color filters when an infrared (IR) color cut filter is not provided.
Figure 30:
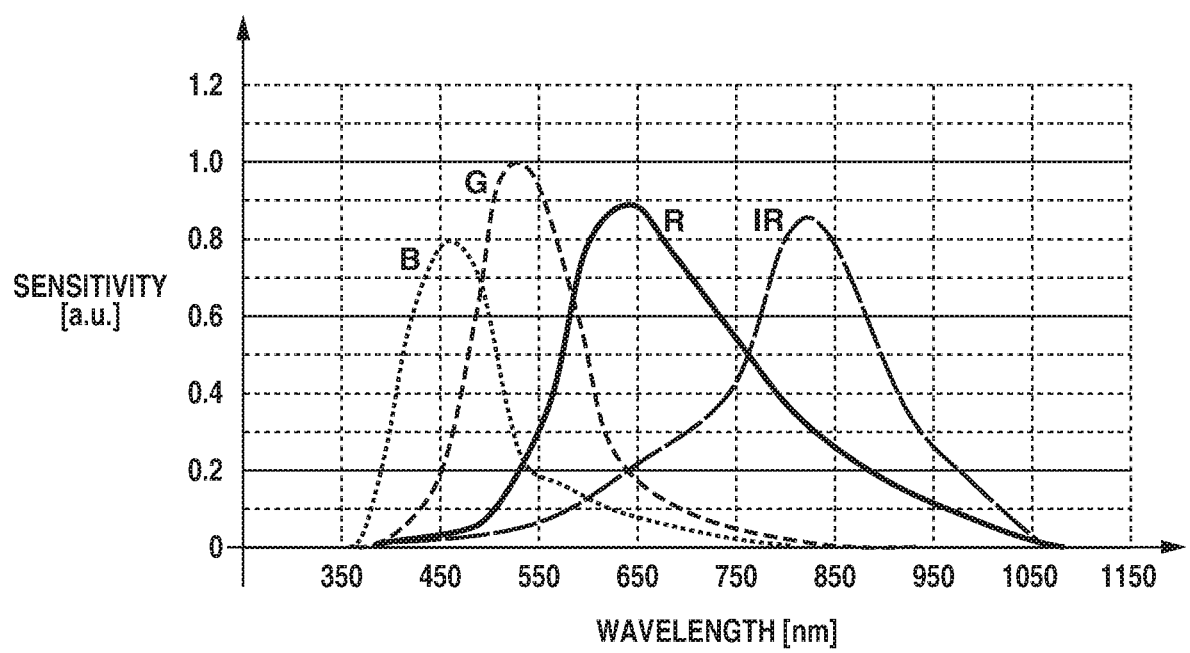
FIG. 30 is a graph indicating a spectrum of the photoelectric conversion apparatus.

FIG. 29A is a graph indicating transmittances of the color filters 103 and 104. In FIGS. 29A and 29B, an infrared (IR) line indicates a transmittance of the color filter 103, and a blue (BL) line, a green (GR) line, and a red (RE) line indicate transmittances of the color filter 104. In FIG. 29A, the color filter 104 includes an IR cut filter, and the color filter 103 does not include the IR cut filter. FIG. 29B illustrates the transmittances of the color filters 103 and 104 in a state before the IR cut filter is provided. In the state illustrated in FIG. 29B, the BL line, the GR line, and RE line exhibit high transmittances in an infrared range (wavelength $\lambda \geq 650$ nm). On the other hand, by providing the IR cut filter, the IR light incident on the color filter 104 is reduced, thereby allowing the IR light to be transmitted only through the color filter 103, as illustrated in FIG. 29A. The IR cut filter refers to, for example, a filter that reflects or absorbs light at a wavelength $\lambda \geq 670$ nm. FIG. 30 is a graph illustrating a spectrum of the photoelectric conversion apparatus 10.

The color filter 103 is a filter on which a transmittance of infrared light is higher than a transmittance of visible light. Light incident on a photoelectric conversion portion by passing through the color filter 103 has a peak wavelength in the infrared range (wavelength $\lambda \geq 650$ nm).

The color filter 104 is a filter having the transmittance of the visible light higher than the transmittance of the infrared light. Light incident on the photoelectric conversion portion by being transmitted through the color filter 104 has a peak wavelength in a visible range (wavelength $\lambda < 650$ nm). The color filter 104 is, for example, a color filter that permits transmission of blue light, red light, or green light therethrough. The color filter 104 may also be a color filter that permits transmission of at least any of cyan light, magenta light, and yellow light therethrough.

FIG. 3 is a cross-sectional view of the pixel region 21 taken along the line III-III' illustrated in FIG. 2. In FIG. 2, only photoelectric conversion portions disposed on a region overlapping the three color filters 103 and 104 is illustrated in a planar view with a broken line, but photoelectric conversion portions are also disposed on a region overlapping other color filters in a similar manner.

The substrate 100 is, for example, a silicon substrate. As illustrated in FIG. 2, the substrate 100 includes a plurality of photoelectric conversion portions 106a and 106b that photoelectrically convert the IR light on the region overlapping the color filter 103 in the planar view. The substrate 100 also includes a plurality of photoelectric conversion portions 106c and 106d that photoelectrically convert the visible light on the region overlapping the color filter 104 in the planar view. The photoelectric conversion portions 106a, 106b, 106c, and 106d are arranged, positioned, or disposed to be adjacent to one another in one direction. Herein, an X axis is defined as an axis along a direction in which the two photoelectric conversion portions 106c and 106d are lined up, and a Y axis is defined as an axis perpendicular to the X axis in a plane in parallel with a surface of the substrate 100 on one side where the filters 103 and 104 are arranged. Further, a Z axis is defined as an axis perpendicular to the X axis and the Y axis. Light is incident from a surface of a micro lens 107 on an opposite side to the one side where the filters 103 and 104 are arranged. Hereinafter, the photoelectric conversion portions will be described omitting the indexes such as a, b, c, and d when a description applies to all of them in common.

In FIGS. 2 and 3, the photoelectric conversion portions 106a and 106b share one micro lens 107. Further, the photoelectric conversion portions 106c and 106d share one micro lens 107. Hereinafter, the plurality of photoelectric conversion portions sharing one micro lens 107 may be collectively referred to as a "photoelectric conversion unit".

Each of the photoelectric conversion portions 106 is formed by implanting an impurity into the substrate 100 from an upper surface side of the substrate 100. Each of the photoelectric conversion portions 106 includes at least an N-type semiconductor region 202 (first semiconductor region), which is the semiconductor region having the first conductivity type in which a signal charge is accumulated. In FIG. 3, each of the photoelectric conversion portions 106 further includes a p-type semiconductor region 203 (second semiconductor region) having the second conductivity type, which is an opposite conductivity type of the first conductivity type. The p-type semiconductor region 203 is disposed on an opposite side of the color filter side of the N-type semiconductor region 202, and forms a p-n junction together with the N-type semiconductor region 202.

As illustrated in FIG. 3, desirably, a p-type semiconductor region 201 is disposed on a surface of the N-type semiconductor region 202 on the color filter side. Due to this configuration, a dark current component generated near the upper surface of the substrate 100 can be reduced.

A p-type semiconductor region 110 is disposed between the N-type semiconductor region 202 of the photoelectric conversion portion 106b and the N-type semiconductor region 202 of the photoelectric conversion portion 106c. A p-type semiconductor region 112 is disposed between the N-type semiconductor region 202 of the photoelectric conversion portion 106a and the N-type semiconductor region 202 of the photoelectric conversion portion 106b. A p-type semiconductor region 111 is disposed between the N-type semiconductor region 202 of the photoelectric conversion portion 106c and the N-type semiconductor region 202 of the photoelectric conversion portion 106d. Each of impurity concentrations of the p-type semiconductor regions 110, 111, and 112 is higher than impurity concentrations of the p-type semiconductor regions 203 and 205. Each of the p-type semiconductor regions 110, 111, and 112 functions as an isolation portion for isolating signals accumulated in the N-type semiconductor region.

Each of the p-type semiconductor regions 110, 111, and 112 has at least one peak of the impurity concentration. Then, a position of a peak of the impurity concentration that is located farthest away from the upper surface of the substrate 100, among peaks that the p-type semiconductor region 112 has, is lower than a position of a peak of the impurity concentration located farthest away from the upper surface of the substrate 100, among peaks that the p-type semiconductor region 111 has. Further, a position of a peak of the impurity concentration that is located farthest away from the upper surface of the substrate 100, among peaks that the p-type semiconductor region 110 has, is lower than the position of the peak of the impurity concentration located farthest away from the upper surface of the substrate 100, among the peaks that the p-type semiconductor region 112 has. Due to this configuration, deterioration of a pixel performance can be reduced. Details will be described below.

Charges generated from the IR light are generated at a high specific gravity at a deep position of the substrate 100 compared to charges generated from the visible light. A case is described where depths of the p-type semiconductor regions 111 and 112 are set to the same depth as each other when the depths of the p-type semiconductor regions 111 and 112 are set. For example, if the depth of the p-type semiconductor region disposed between the plurality of photoelectric conversion portions that photoelectrically converts the IR light is set to the same depth as the depth of the p-type semiconductor region disposed between the plurality of photoelectric conversion portions that photoelectrically converts the visible light, the charges are mixed without being isolated between the plurality of photoelectric conversion portions that photoelectrically converts the IR light. On the other hand, if the depth of the p-type semiconductor region disposed between the plurality of photoelectric conversion portions that photoelectrically converts the visible light is set to the same depth as the depth of the p-type semiconductor region disposed between the plurality of photoelectric conversion portions that photoelectrically converts the IR light, a knee characteristic may be deteriorated and the pixel performance may be reduced at the plurality of photoelectric conversion portions that photoelectrically converts the visible light.

The deterioration of the knee characteristic refers to an unintentional bend of a line of a graph at an intermediate position when the graph is drawn with a horizontal axis representing an amount of light incident on a pixel and a vertical axis representing the number of saturation electrons of the pixel. The deterioration of the knee characteristic leads to deterioration of an input/output characteristic. The knee characteristic is deteriorated due to, for example, an undesirable leak of the charges saturated at the photoelectric conversion portion 106a not only to the photoelectric conversion portion 106b but also to the photoelectric conversion portion 106c. The deterioration of the knee characteristic can be prevented by arranging the configuration so that the charges saturated at the photoelectric conversion portions 106a and 106b flow to the photoelectric conversion portions 106a and 106b in the same pixel.

According to the present exemplary embodiment, since the depth of the p-type semiconductor region is changed to suit the characteristic of the photoelectric conversion portion, the photoelectric conversion apparatus 10 can carry out accurate focus detection while preventing the deterioration of the knee characteristic at each of the pixels.

As illustrated in FIG. 4, a gate electrode 130a of a transfer transistor for transferring the charges in the photoelectric conversion portion 106a, and a gate electrode 130b of a transfer transistor for transferring the charges in the photoelectric conversion portion 106b are disposed on the upper surface of the substrate 100. The charges are transferred to floating diffusions (FDs) 131a and 131b by the individual transfer transistors.

As illustrated in FIG. 3, the color filters 103 and 104 and the micro lens 107 are disposed on the upper surface of the substrate 100 via a wiring layer 150 including an insulation film 109 and a wiring 113.

The insulation film 109 included in the wiring layer 150 is light-transmissive. The insulation film 109 may be a single layer or may be a multi-layer film formed by stacking a plurality of layers made from different materials. In the case of the single layer, the insulation film 109 is made from, for example, silicon oxide (SiO2). On the other hand, in the case of the multi-layer film, the insulation film 109 includes, for example, a layer made from any of resin, silicon oxide ($SiO_2$), silicon nitride ($Si_3N_4$), and silicon carbide (SiC). The material of the micro lens 107 is, for example, resin.

The peripheral circuit region will be described with reference to FIG. 1. As illustrated in FIG. 1, the peripheral circuit region includes a vertical scanning circuit 22, a readout circuit 23, a horizontal scanning circuit 24, and an output amplifier 25.

The vertical scanning circuit 22 is connected to the plurality of pixels 20 arranged in the pixel region 21. The plurality of pixels 20 connected to the vertical scanning circuit 22 is, for example, the plurality of pixels 20 arranged in the column direction. The vertical scanning circuit 22 scans the pixels 20 by selecting a row from which a signal to be acquired from the pixel 20 is output.

The plurality of pixels 20 arranged in the pixel region 21 is connected to the readout circuit 23 via a vertical signal line. The readout circuit 23 includes, for example, a column amplifier, a correlated double sampling (CDS) circuit, and an addition circuit. The readout circuit 23 reads out signals from the plurality of pixels 20 selected by the vertical scanning circuit 22. The plurality of pixels 20 connected to the readout circuit 23 is, for example, the plurality of pixels 20 arranged in the row direction.

The horizontal scanning circuit 24 is connected to the readout circuit 23. The horizontal scanning circuit 24 generates a signal for sequentially reading out the signal based on the pixel signal from the readout circuit 23.

The output amplifier 25 is connected to the readout circuit 23, and amplifies and outputs a plurality of signals selected by the horizontal scanning circuit 24. The plurality of signals selected by the horizontal scanning circuit 24 is, for example, the signals of the plurality of pixels 20 arranged in the column direction.

The configuration of the photoelectric conversion apparatus 10 according to the present exemplary embodiment is not limited to the above-described configuration. For example, an exemplary modification of the photoelectric conversion apparatus 10 according to the present exemplary embodiment will be described below.

One photoelectric conversion unit 101 and one photoelectric conversion unit 102 each include the two photoelectric conversion portions 106a and 106b or 106c and 106d in FIG. 3, but one photoelectric conversion unit may also include three or more photoelectric conversion portions. In such case, the three or more photoelectric conversion portions are arranged on the region overlapping one micro lens in the planar view. Further, the photoelectric conversion apparatus 10 may include a photoelectric conversion unit including only one photoelectric conversion portion. In this case, the one photoelectric conversion portion is arranged on the region overlapping one micro lens in the planar view.

The plurality of photoelectric conversion portions shares one micro lens in FIG. 3, but one photoelectric conversion portion may be arranged on the region overlapping one micro lens in the planar view as illustrated in FIG. 5. In this case as well, the photoelectric conversion apparatus 10 can make it difficult for the generated charges to be mixed between the photoelectric conversion portions and also prevent the charges generated based on light of different colors from being mixed together.

As illustrated in FIG. 6, the N-type semiconductor region may include an N-type semiconductor region 202A and an N-type semiconductor region 202B having a lower doped impurity concentration than the N-type semiconductor region 202A. The N-type semiconductor region 202B is disposed between the N-type semiconductor region 202A and the p-type semiconductor region 203. In this case, the depths of the p-type semiconductor regions 110 and 112 may be set to greater depths than a p-n junction surface. Due to this configuration, the photoelectric conversion apparatus 10 can reduce a ratio at which the charges generated in the p-type semiconductor region 203 leak to the photoelectric conversion portion that photoelectrically converts light of a different color.

The term "doped impurity concentration" described herein means a concentration of an actually doped impurity. The above-described doped impurity concentration can be measured by, for example, the Secondary Ion Mass Spectroscopy (SIMS) method or the Scanning Capacitance Microscope (SCM) method. With use of these methods, how much this impurity is contained per unit volume can be checked.

On the other hand, the term "impurity concentration" described in the present disclosure means a net impurity concentration after the doped impurity concentration is compensated by an impurity having an opposite conductivity type. For example, if an N-type doped impurity concentration is higher than a p-type doped impurity concentration in a certain region, this region becomes an N-type semiconductor region. On the other hand, if a p-type doped impurity concentration is higher than an N-type doped impurity concentration in a certain region, this region becomes a p-type semiconductor region.

In FIG. 6, the depth of the p-n junction surface of the photoelectric conversion portion disposed so as to overlap the color filter 103 in the planar view may be set to a lower depth than the depth of the p-n junction surface of the photoelectric conversion portion disposed so as to overlap the color filter 104 in the planar view.

Figure 7A:
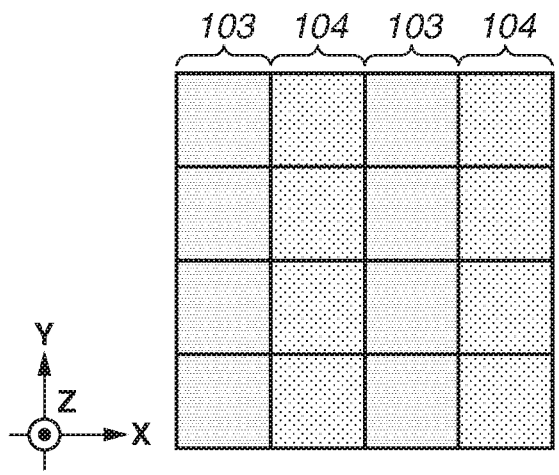
FIGS. 7A, 7B, and 7C are diagrams each illustrating a variation of the layout of the color filters.
Figure 7B:
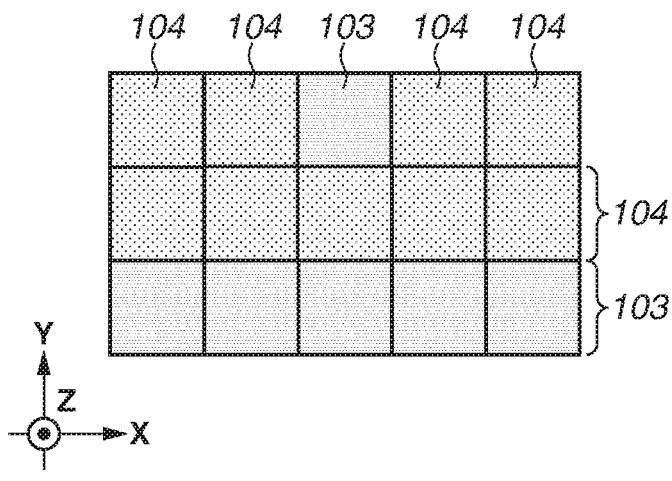
Figure 7C:
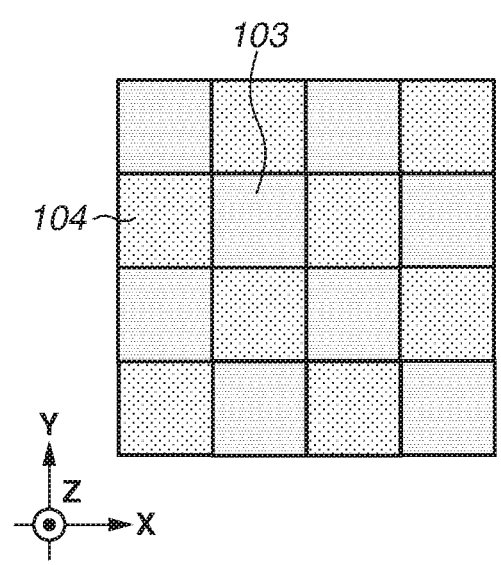

FIGS. 7A to 7C each illustrate a variation in the layout of the color filters 103 and 104. As illustrated in FIGS. 3 and 6, desirably, identically configured photoelectric conversion units are arranged at both ends of the photoelectric conversion unit 101. In other words, desirably, the photoelectric conversion unit 101 is disposed between the two photoelectric conversion units 101, or the photoelectric conversion unit 101 is disposed between the two photoelectric conversion units 102. Due to this configuration, the photoelectric conversion apparatus 10 can reduce such a phenomenon that an amount of charges that move becomes asymmetric, thereby making deterioration of the focus detection performance less likely.

The color filter is not limited to four colors or five colors and may also be a multi-band color filter supporting six or more colors. By employing the multi-band color filter, the photoelectric conversion apparatus 10 can acquire spectroscopic information of a subject in detail.

Figure 8:
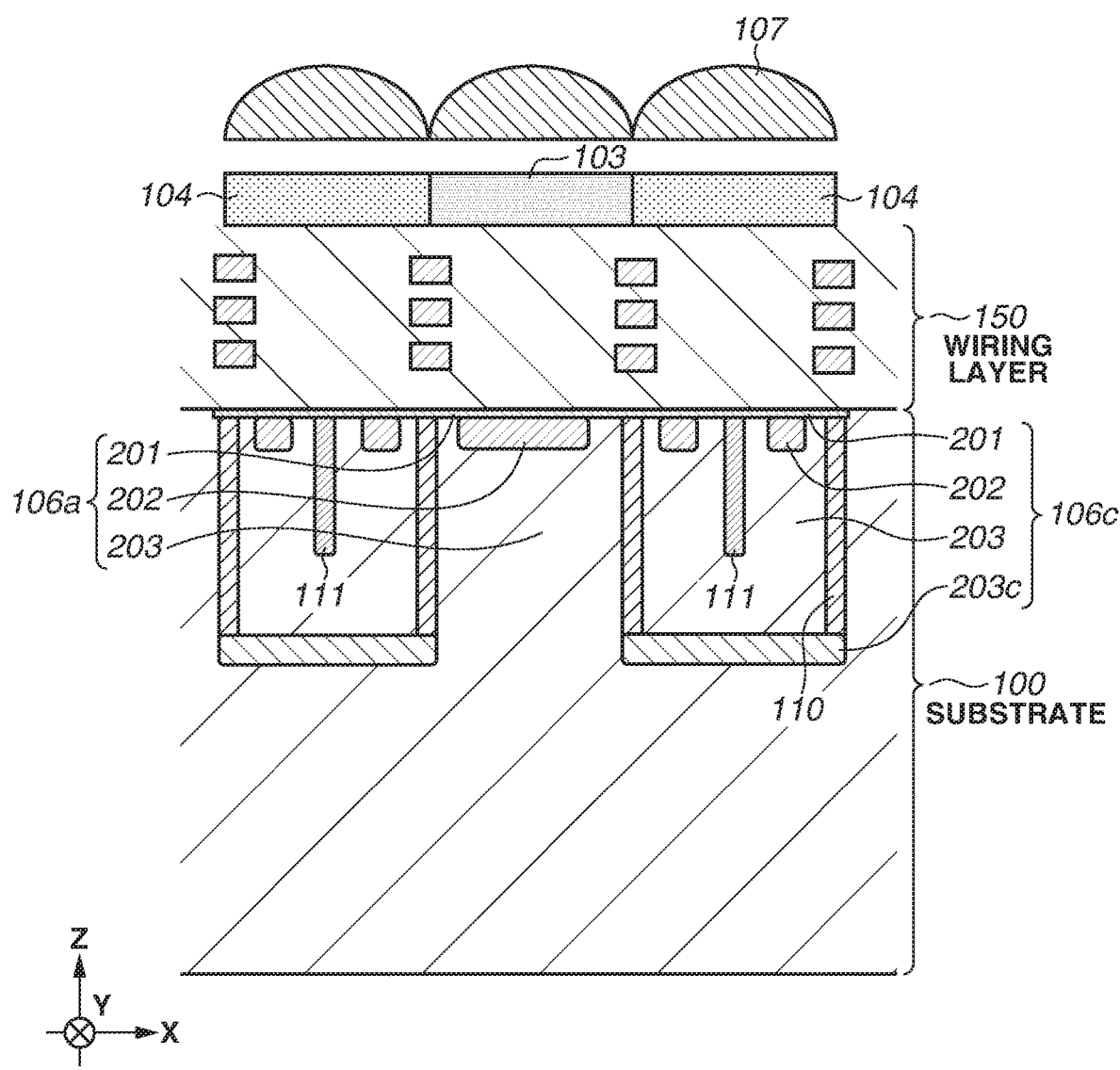
FIG. 8 is a cross-sectional view of a part of a pixel region according to a second exemplary embodiment.

FIG. 8 is a cross-sectional view of a part of the pixel region 21 of a photoelectric conversion apparatus according to a second exemplary embodiment. The photoelectric conversion apparatus according to the present exemplary embodiment is different from the photoelectric conversion apparatus 10 according to the first exemplary embodiment in that the p-type semiconductor region disposed so as to overlap the color filter 104 in the planar view includes a portion in which the impurity concentration is higher than that in the p-type semiconductor region disposed so as to overlap the color filter 103 in the planar view. In the description below, the second exemplary embodiment will be described by omitting descriptions of configurations similar to the photoelectric conversion apparatus 10 according to the first exemplary embodiment.

In the present exemplary embodiment, the photoelectric conversion apparatus includes the second semiconductor region (p-type semiconductor region) disposed on the opposite side of the color filter 103 side of the N-type semiconductor region 202, disposed so as to overlap the N-type semiconductor region 202 in the planar view, and forming the p-n junction together with the N-type semiconductor region 202, similarly to the first exemplary embodiment. Then, in the present exemplary embodiment, the impurity concentration of at least a part of the p-type semiconductor region of at least one photoelectric conversion portion is lower than the impurity concentration of a portion in the p-type semiconductor regions of the plurality of photoelectric conversion portions that is disposed at the same depth as the at least a part of the p-type semiconductor region. More specifically, in FIG. 8, the doped impurity concentration of a p-type semiconductor region 203c is higher than the doped impurity concentration of the p-type semiconductor region 203 forming the p-n junction together with the N-type semiconductor region 202 of the photoelectric conversion portion 106a. The p-type semiconductor region 203c is included in the p-type semiconductor region of the photoelectric conversion portion corresponding to the color filter 104. In the present exemplary embodiment, as illustrated in FIG. 8, the doped impurity concentration of the p-type semiconductor region 203 of the photoelectric conversion portion 106a is lower than the doped impurity concentration of the p-type semiconductor region 203c of the photoelectric conversion portions 106c and 106d at a predetermined depth from the surface of the substrate 100 on the color filters 103 and 104 side. In other words, at the same depth as the p-type semiconductor region 203c, the p-type semiconductor region 203c is not disposed in the photoelectric conversion portion corresponding to the color filter 103. Therefore, at the same depth as the p-type semiconductor region 203c, the impurity concentration of the p-type semiconductor region 203c disposed so as to overlap the color filter 104 is higher than the impurity concentration of the p-type semiconductor region 203 disposed so as to overlap the color filter 103. The predetermined depth is located at, for example, a position separated from the surface of the substrate 100 on the color filter side by 2.0 µm or more. Due to the layout of the p-type semiconductor region 203c at the position separated by 2.0 µm or more, the charges generated from the red light in the N-type semiconductor regions 202 included in the photoelectric conversion portions 106c and 106d can be collected.

The p-type semiconductor region 203c functions as a barrier layer against the charges photoelectrically converted from the IR light. Due to the provision of the p-type semiconductor region 203c, the photoelectric conversion apparatus can prevent the charges, which photoelectrically convert the visible light, from being mixed into the photoelectric conversion portions 106c and 106d even when the photoelectric conversion is carried out below the p-type semiconductor region 203c due to the light transmitted through the color filter 103. Further, the charges generated below the p-type semiconductor region 203c from the IR light can move to the N-type semiconductor region 202 of the photoelectric conversion portion 106a, thereby improving sensitivity to the IR light. Further, due to the provision of only one photoelectric conversion portion in the region overlapping the color filter 103 in the planar view, the photoelectric conversion apparatus of the second exemplary embodiment can reduce the number of FDs compared to the first exemplary embodiment, thereby reducing noise.

The configuration of the photoelectric conversion apparatus according to the present exemplary embodiment is not limited to the above-described configuration. For example, an exemplary modification of the photoelectric conversion apparatus according to the present exemplary embodiment will be described now.

Each of the p-type semiconductor regions 110, 111, and 112 may be disposed around an insulator.

The p-type semiconductor region 203c may be disposed at a position shallower than 2.0 μm depending on intended use. For example, in a case where the color filter 103 is a color filter that permits the transmission of the blue light therethrough or permits the transmission of the green light therethrough, the p-type semiconductor region 203c may be disposed at the position shallower than 2.0 μm.

Figure 9:
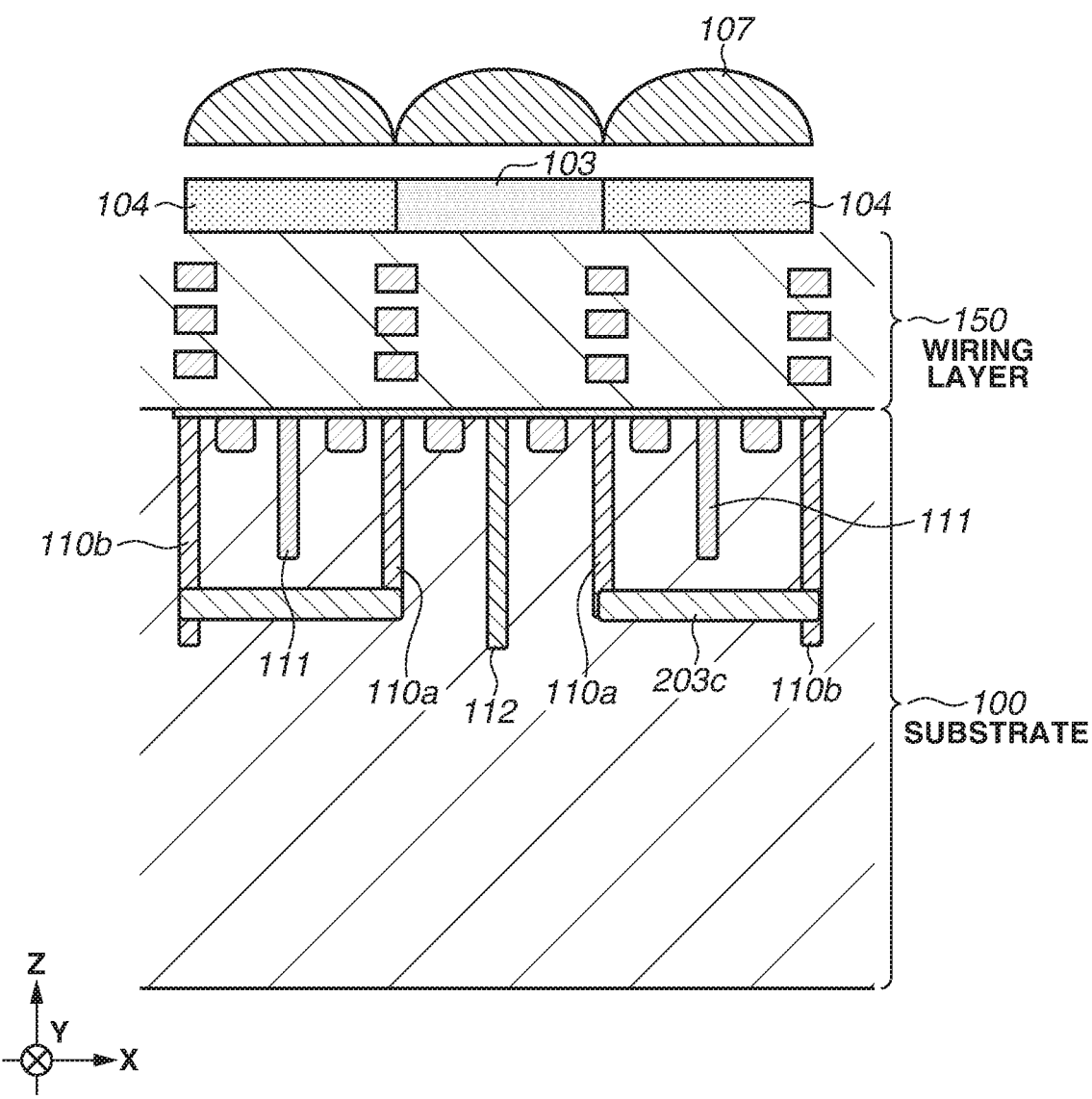
FIG. 9 is a cross-sectional view of a part of a pixel region according to an exemplary modification of the second exemplary embodiment.

In FIG. 8, each of the p-type semiconductor regions 110 is disposed at the same depth as one another. The present exemplary embodiment is not limited thereto, and, as illustrated in FIG. 9, a p-type semiconductor region 110a disposed around the photoelectric conversion portion that photoelectrically converts the IR light may be disposed at a shallower depth than a depth of a p-type semiconductor region 110b disposed between the photoelectric conversion portion that photoelectrically converts the IR light and the photoelectric conversion portion that photoelectrically converts the visible light. Thus, a lower end of the p-type semiconductor region 110b may be disposed at a position that is separated farther away from the upper surface of the substrate 100 than a position of a lower surface of the p-type semiconductor region 203c. The charges generated below the p-type semiconductor region 203c are diffused. At this time, the presence of the p-type semiconductor region 110b facilitates a movement of the charges to the N-type semiconductor region of the photoelectric conversion portion that photoelectrically converts the IR light, thereby contributing to improving the sensitivity to the IR light.

Figure 10:
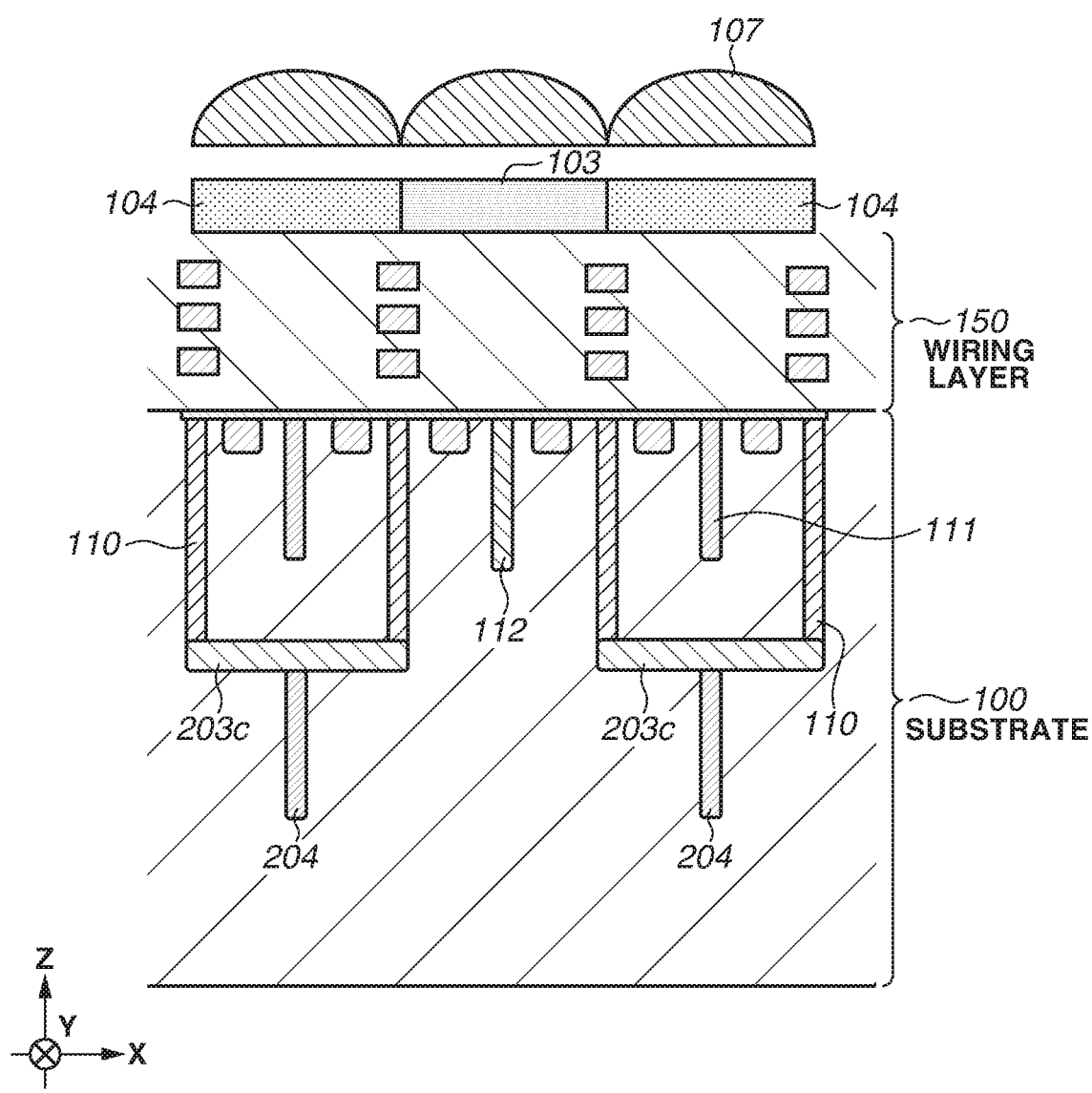
FIG. 10 is a cross-sectional view of a part of a pixel region according to an exemplary modification of the second exemplary embodiment.

As illustrated in FIG. 10, a p-type semiconductor region 204 in parallel with the Z axis may be disposed below the p-type semiconductor region 203c. A doped impurity concentration of the p-type semiconductor region 204 is higher than the doped impurity concentration of the p-type semiconductor region 203. In this case as well, the sensitivity to the IR light can be improved.

In FIG. 8, one photoelectric conversion portion is disposed so as to overlap the color filter 103 in the planar view, but as illustrated in FIG. 9, a plurality of photoelectric conversion portions may be disposed so as to overlap the color filter 103 in the planar view.

In FIG. 8, the p-type semiconductor region includes the p-type semiconductor region 203, which is a third portion, and the p-type semiconductor region 203c, which is a fourth portion, and the p-n junction is formed by the third portion and the N-type semiconductor region 202. The present exemplary embodiment is not limited thereto, and the photoelectric conversion portion may include N-type semiconductor regions 202a and 202b, and the p-n junction may be formed by the N-type semiconductor region 202b and the p-type semiconductor region 203c. In this case, the p-n junction is formed by the N-type semiconductor region 202b and the p-type semiconductor region 203.

Figure 11:
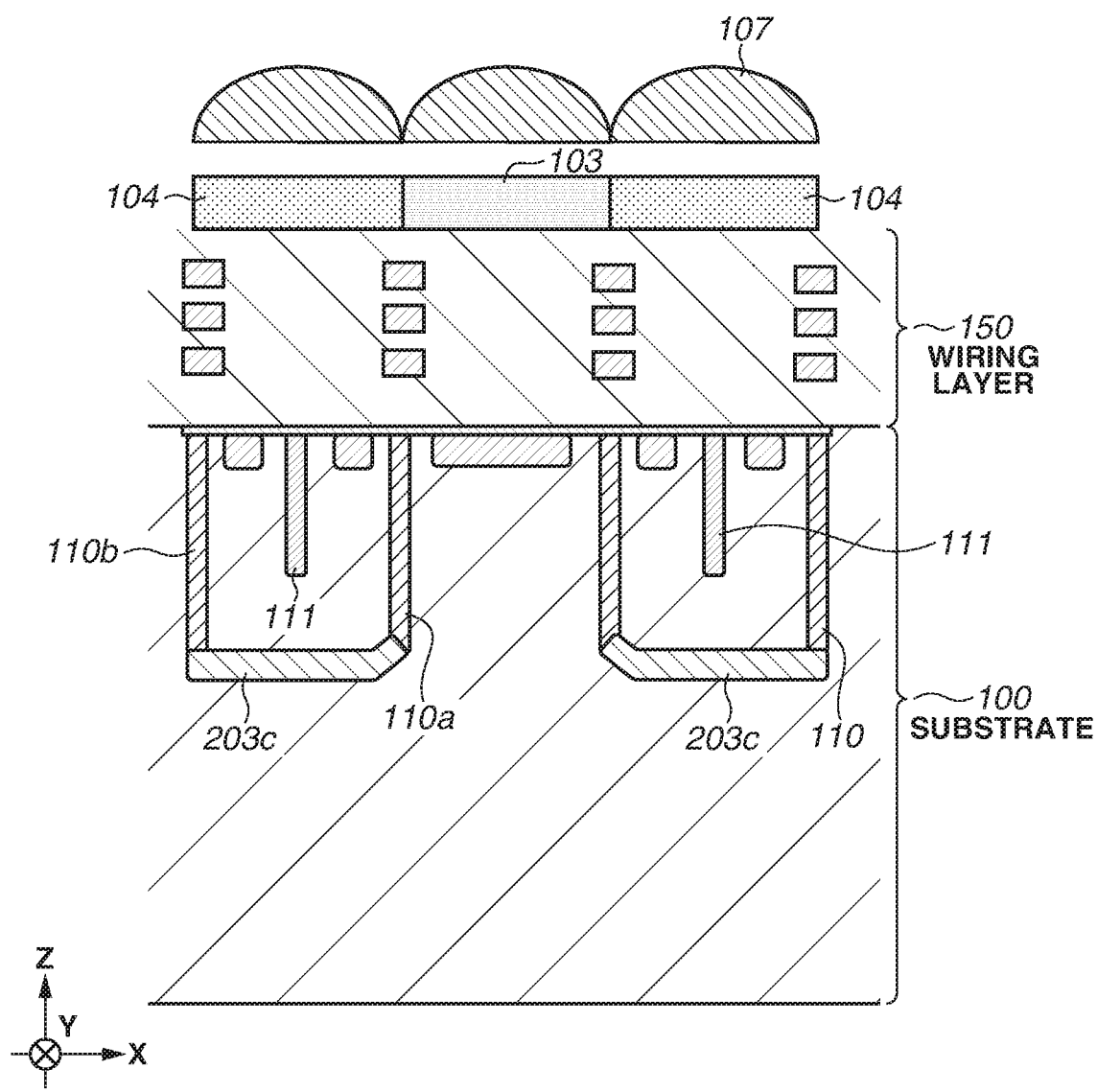
FIG. 11 is a cross-sectional view of a part of a pixel region according to a third exemplary embodiment.

FIG. 11 is a cross-sectional view of the pixel region 21 of a photoelectric conversion apparatus according to a third exemplary embodiment. The photoelectric conversion apparatus according to the present exemplary embodiment is different from the photoelectric conversion apparatus according to the second exemplary embodiment in that the depth of the p-type semiconductor region 203c from the upper surface of the substrate 100 reduces as the p-type semiconductor region 203c approaches the photoelectric conversion portion that photoelectrically converts the IR light. In the description below, the third exemplary embodiment will be described by omitting descriptions of configurations similar to the photoelectric conversion apparatus according to the second exemplary embodiment.

When the p-type semiconductor region 203c is disposed in parallel with the X axis, a potential barrier may be generated due to the p-type semiconductor region 110 and the p-type semiconductor region 203c. The generation of the potential barrier impedes the movement of the charges photoelectrically converted below the p-type semiconductor region 203c to the photoelectric conversion portion that photoelectrically converts the IR light. To avoid this inconvenience, as illustrated in FIG. 11, placing the p-type semiconductor region 203c at a shallow depth makes the generation of the potential barrier difficult. Thus, the photoelectric conversion apparatus can cause the charges photoelectrically converted below the p-type semiconductor region 203c to be efficiently moved to the photoelectric conversion portion that photoelectrically converts the IR light, thereby improving the sensitivity to the infrared light.

In FIG. 11, one photoelectric conversion portion is disposed in the region overlapping one micro lens 107 and the color filter 103 in the planar view, but a plurality of photoelectric conversion portions may be disposed in the region overlapping one micro lens 107 and the color filter 103 in the planar view.

A photoelectric conversion apparatus according to a fourth exemplary embodiment is directed to solving a problem that will be described below.

Conventionally, there has been an image sensor (photoelectric conversion apparatus) including a mix of a visible pixel (RGB pixel) that receives visible light and a near-infrared pixel (Z pixel; an IR pixel) that receives near-infrared light. "A 1.5 Mpixel RGBZ CMOS Image Sensor for Simultaneous Color and Range Image Capture" written by Wonjoo Kim, Wang Yibing, Ilia Ovsiannikov, Seung-Hoon Lee, Yoondong Park, Chilhee Chung, and Eric Fossum, and published in Solid-State Circuits Conference Digest of Technical Papers (the International Solid-State Circuits Conference (ISSCC)), Session 22/Image Sensors/22.7, 2012 Institute of Electrical and Electronics Engineers (IEEE) International, February 2012, pages 392 to 394 (Wonjoo paper) discloses an image sensor including a potential barrier (deep isolation region) below a photodiode of the visible pixel to prevent signal charges in a near-infrared range that is photoelectrically converted in a deep portion of a substrate from entering the visible pixel.

However, with the image sensor (photoelectric conversion apparatus) disclosed in the Wonjoo paper, for example, if an impurity contained in the potential barrier is diffused into a surrounding region, a potential barrier may be unintentionally generated against the signal charges in the near-infrared range at the near-infrared pixel.

Thus, the present exemplary embodiment is directed to inhibiting the potential barrier at the pixel that receives the near-infrared light in the photoelectric conversion apparatus that receives the visible light and the near-infrared light.

In the descriptions below, the photoelectric conversion apparatus (solid-state imaging apparatus) according to the fourth exemplary embodiment of the present disclosure will be described. The present exemplary embodiment will be described focusing on a photoelectric conversion apparatus equipped with a deep isolation region formed to include an opening having a size (width) larger than a size (width) of the pixel that receives the near-infrared light, thereby inhibiting the potential barrier against the signal charges (electrons) at this pixel. The near-infrared light (light in the near-infrared range) in the present exemplary embodiment refers to light including light at a wavelength of 0.70 to 1.4 μm in length.

[Configuration of Photoelectric Conversion Apparatus]

Figure 12B:
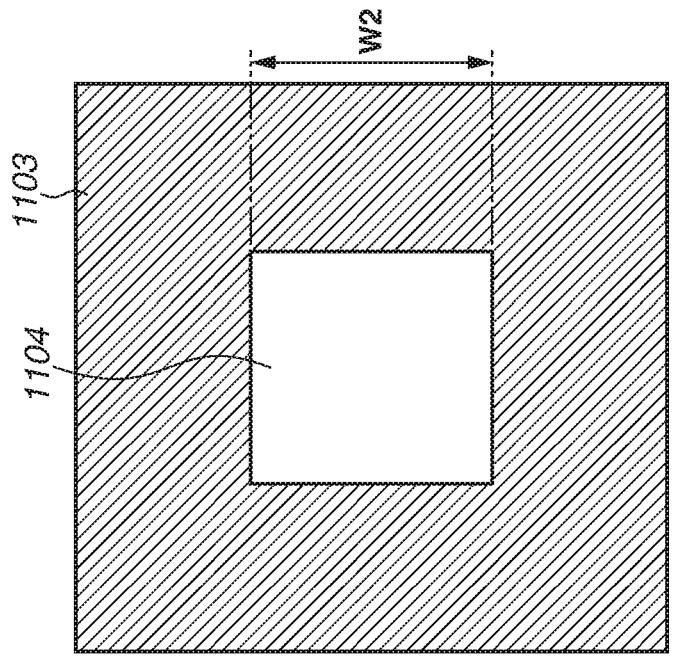
FIGS. 12A and 12B are plan views of a photoelectric conversion apparatus according to a fourth exemplary embodiment.
Figure 12A:
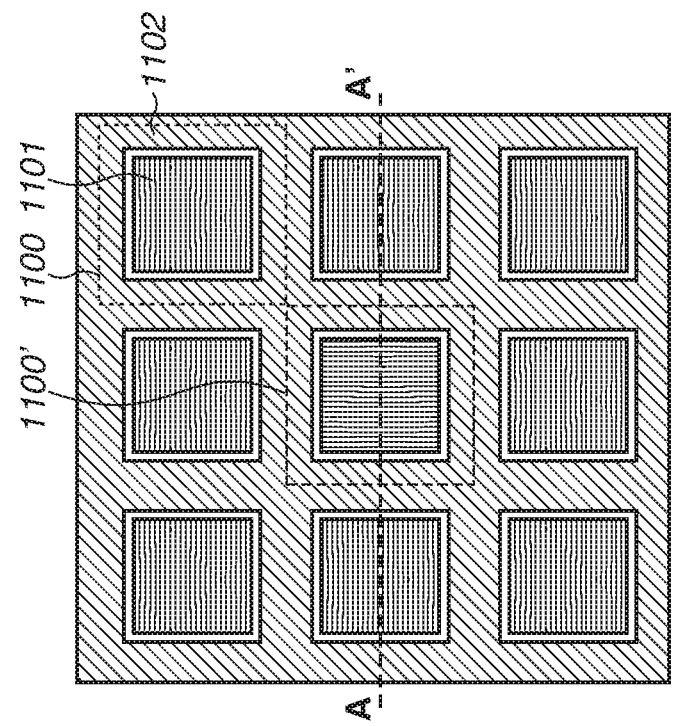
Figure 13A:
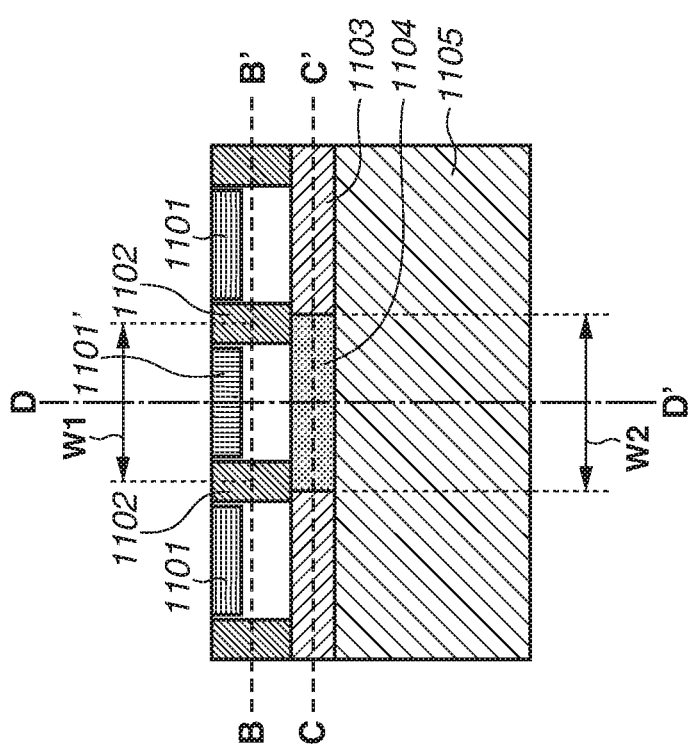
FIGS. 13A and 13B are cross-sectional views of the photoelectric conversion apparatus according to the fourth exemplary embodiment.

A configuration of the photoelectric conversion apparatus according to the present exemplary embodiment will be described with reference to FIGS. 12A, 12B, and 13A. FIG. 13A is a cross-sectional view of the photoelectric conversion apparatus according to the present exemplary embodiment, and FIGS. 12A and 12B are plan views of the photoelectric conversion apparatus (diagrams in the planar view; cross-sectional views perpendicular to the vertical direction). In particular, FIG. 12A is a plan view illustrating a cross section taken along a line B-B' illustrated in FIG. 13A, and FIG. 12B is a plan view illustrating a cross section taken along a line C-C' illustrated in FIG. 13A. Further, FIG. 13A is a cross-sectional view illustrating a cross section taken along a line A-A' illustrated in FIG. 12A.

The photoelectric conversion apparatus includes a pixel 1100 and a pixel 1100', and includes a charge accumulation portion 1101, a charge accumulation portion 1101', a pixel isolation region 1102, a deep isolation region 1103, a non-isolation region 1104, and a photoelectric conversion region 1105.

Figure 13B:
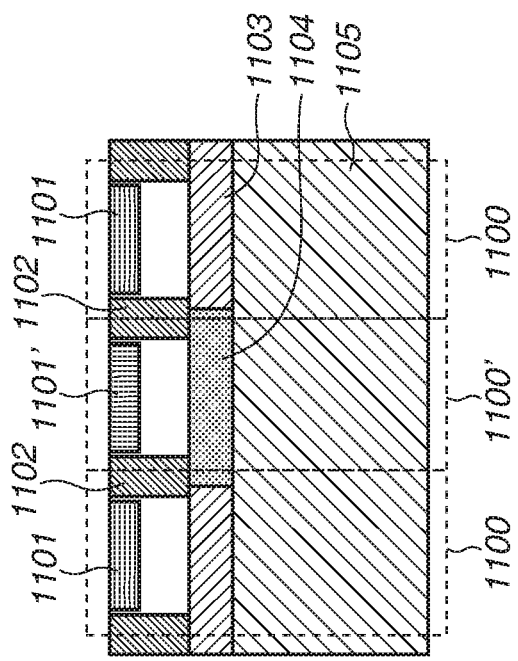

Hereinafter, an "upper portion" will refer to one side of the non-isolation region 1104 on which the charge accumulation portion 1101' is formed. When the "upper portion" is defined in this manner, light such as the visible light and the near-infrared light can be said to be incident from the upper portion of the photoelectric conversion apparatus. A "lower portion" or a "deep portion" will refer to an opposite side of the "upper portion", and a "depth" and a "height" will refer to a position in the vertical direction. In the present exemplary embodiment, the pixel will refer to each one region surrounded by a dotted line in FIG. 13B and a region into which the photoelectric conversion apparatus illustrated in FIG. 13A is divided vertically based on a center of the pixel isolation region 1102.

The pixel 1100 is a pixel that receives the visible light. The pixel 1100' is a pixel that receives the near-infrared light (light in the near-infrared range). The pixel 1100 includes the charge accumulation portion 1101 that accumulates the signal charges into which the visible light is photoelectrically converted. The pixel 1100' includes the charge accumulation portion 1101' that accumulates the signal charges into which the near-infrared light is photoelectrically converted. The charge accumulation portions 1101 and 1101' are each an N-type region (N-type semiconductor region; N-type impurity region) containing an N-type impurity in a large amount. The pixels 1100 and 1100' each include the pixel isolation region 1102 arranged so as to surround the charge accumulation portion 1101 or 1101' and isolate adjacent pixels (adjacent charge accumulation portions). In the present exemplary embodiment, the pixel isolation region 1102 is a p-type region (p-type semiconductor region; p-type impurity region) that isolates the adjacent pixels as a result of containing a p-type impurity in a large amount.

In the present exemplary embodiment, a filter for selecting the light to be transmitted therethrough (not illustrated) is formed on each of the pixel 1100 that receives the visible light and the pixel 1100' that receives the near-infrared light. This filter selects (determines) the light to be transmitted through each of the pixels based on the wavelength of the light. The filter formed on the pixel 1100 permits the transmission of the visible light therethrough, and the filter formed on the pixel 1100' permits the transmission of the near-infrared light therethrough. In other words, it can be said that the filter determines whether the charges accumulated in the charge accumulation portions 1101 and 1101' are the charges resulting from photoelectrically converting the visible light or the charges resulting from photoelectrically converting the near-infrared light. In addition, the filter (color filter) formed on the pixel 1100 has an uneven shape, and therefore a planarization film not having a filter function is further formed on the filter. The near-infrared light reaches a greater depth compared to the visible light, and the near-infrared light is received (photoelectrically converted) at a deep portion, so that the filter does not have to be formed on the pixel 1100' in the case where the planarization film is formed.

In the present exemplary embodiment, the pixel 1100 is formed adjacently so as to surround the pixel 1100' that receives the near-infrared light. Further, the present exemplary embodiment is described assuming that 9 pixels are formed two-dimensionally in the vertical and horizontal directions as illustrated in FIG. 12A for purpose of simplification, but the pixels may also be arrayed one-dimensionally, and more than 9 pixels may be formed.

The deep isolation region 1103 is a p-type region (p-type semiconductor region) formed in a region below the charge accumulation portion 1101 and the pixel isolation region 1102 and electrically connected to the pixel isolation region 1102. The deep isolation region 1103 contains a p-type impurity in a large amount, and therefore is higher in impurity concentration than the non-isolation region 1104 and is higher in potential for the signal charges generated by the photoelectric conversion region 1105 than the non-isolation region 1104. Due to this configuration, the deep isolation region 1103 functions as the potential barrier between the charge accumulation portion 1101 and the photoelectric conversion region 1105 against the signal charges generated by the photoelectric conversion region 1105. The potential barrier in the present exemplary embodiment serves to prevent the targeted charges from flowing into the region. Herein, the deep isolation region 1103 is formed by implanting the p-type impurity into the semiconductor substrate.

The non-isolation region 1104 is a region where the deep isolation region 1103 is not formed to take in the signal charges of the near-infrared light photoelectrically converted by the photoelectric conversion region 1105 into the charge accumulation portion 1101'. Herein, the non-isolation region 1104 is formed at the same depth (height) as the deep isolation region 1103.

The photoelectric conversion region 1105 is formed in a region below the non-isolation region 1104 of the pixel 1100', and photoelectrically converts the near-infrared light. The signal charges generated by photoelectrically converting the near-infrared light are accumulated in the charge accumulation portion 1101'. The photoelectric conversion region 1105 can also photoelectrically convert the visible light depending on the depth of the deep isolation region 1103.

The photoelectric conversion apparatus can receive the visible light at the pixel 1100 and receive the near-infrared light at the pixel 1100' by being configured in this manner. Further, the signal charges of the near-infrared light photoelectrically converted by the photoelectric conversion region 1105 can be accumulated (caught) in the charge accumulation portion 1101' of the pixel 1100'. In the above description, a case is described where, for example, the non-isolation region 1104 is the p-type semiconductor region, but it is not limited thereto as long as the non-isolation region 1104 has a lower potential for the signal charges than that of the deep isolation region 1103. Thus, the non-isolation region 1104 may also be formed as an N-type semiconductor region. [Relationship between Pixel and Size of Opening of Deep Isolation Region]

In the descriptions below, a relationship between a size of the pixel 1100' and a size of an opening of the deep isolation region 1103 in the present exemplary embodiment will be described.

Herein, the size (width) of the pixel 1100' is W1, which is a distance between the centers of the pixel isolation regions 1102 as illustrated in FIG. 13A. As illustrated in FIG. 12B, the size of the opening of the deep isolation region 1103 is W2, which is a size of the non-isolation region 1104.

The deep isolation region is also provided as the potential barrier in the Wonjoo paper, but the size W2 of the opening of the deep isolation region is considered to be the same as the pixel size W1 in the Wonjoo paper. Herein, FIG. 14A illustrates a potential for the signal charges in a cross section along a line D-D' in FIG. 13A in a case where the opening size W2≤the pixel size W1. In this case, since the opening size W2 is equal to or smaller than the pixel size W1, the potential barrier as in the example illustrated in FIG. 14A is generated in the non-isolation region 1104 due to diffusion of the impurity implanted in the deep isolation region 1103 into the non-isolation region 1104.

Thus, in the present exemplary embodiment, the potential for the signal charges in the non-isolation region 1104 is reduced as illustrated in FIG. 14B by setting the opening size W2 of the deep isolation region 1103 to a larger size than the pixel size W1 to eliminate the influence of the diffusion of the impurity. Due to this arrangement, the signal charges photoelectrically converted in the region below the deep isolation region 1103 can be accumulated (caught) in the charge accumulation portion 1101'. Herein, setting the opening size W2 of the deep isolation region 1103 to a larger size than the pixel size W1 can be said to specifically mean arranging the layout in such a manner that the pixel 1100' is contained in the non-isolation region 1104 when the photoelectric conversion apparatus is transparently viewed from above.

The present exemplary embodiment has been described referring to the photoelectric conversion apparatus in which the deep isolation region 1103 surrounds the non-isolation region 1104, and the opening size W2 of the deep isolation region 1103 and the pixel size W1 of the pixel 1100' are W2>W1. However, the present exemplary embodiment is not limited thereto, and the pixel isolation region 1102 may surround a part of the non-isolation region 1104 as illustrated in FIG. 15A. In this case, the photoelectric conversion apparatus can also achieve the above-described effects by being configured in such a manner that a size W3 of an opening along which this pixel isolation region 1102 surrounds the non-isolation region 1104 is larger than the pixel size W1, in addition to the above-described relationship between the opening size W2 and the pixel size W1.

The pixel isolation region 1102 has been described as being the isolation region that isolates the pixels as a result of containing the p-type impurity in a large amount, but is not limited thereto. For example, the pixel isolation region 1102 may be a trench (groove) 1106 as in an example illustrated in FIG. 15B that is formed with use of a technique such as deep trench isolation. In this case, the adjacent pixels are isolated therebetween by an insulating material embedded into the trench 1106 in the present exemplary embodiment.

[Method for Manufacturing Photoelectric Conversion Apparatus]

Figure 16:
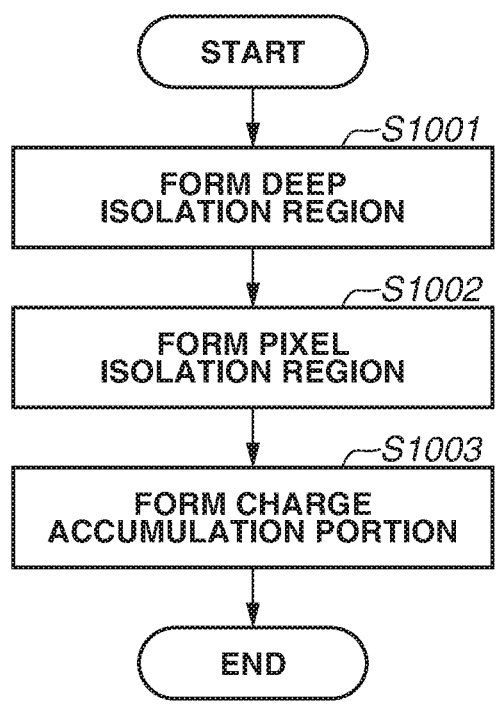
FIG. 16 is a flowchart illustrating a flow of a method for manufacturing the photoelectric conversion apparatus according to the fourth exemplary embodiment.
Figure 17B:
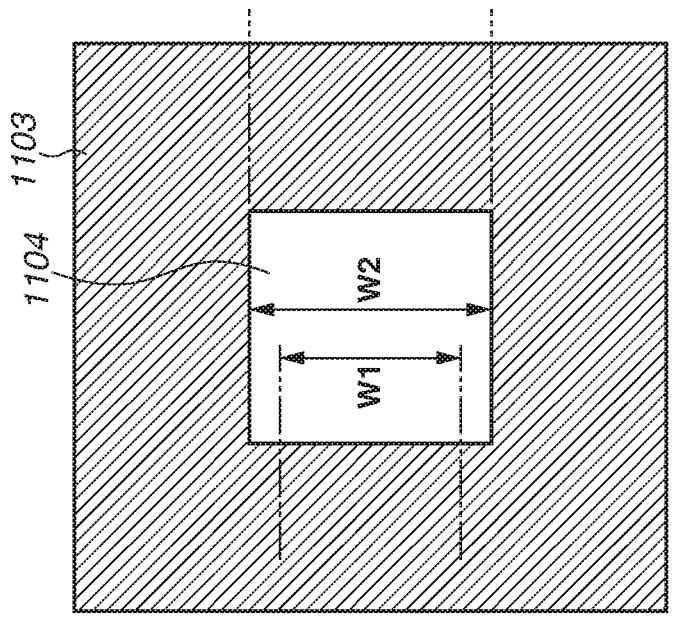
FIGS. 17A and 17B are diagrams illustrating the method for manufacturing the photoelectric conversion apparatus according to the fourth exemplary embodiment.
Figure 17A:
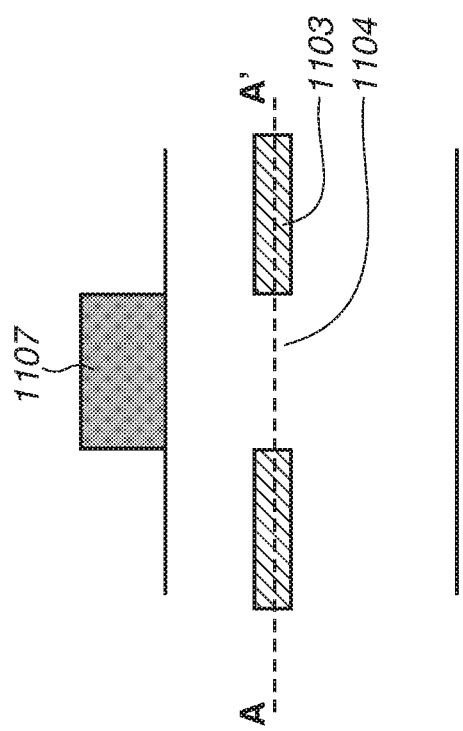
Figure 19B:
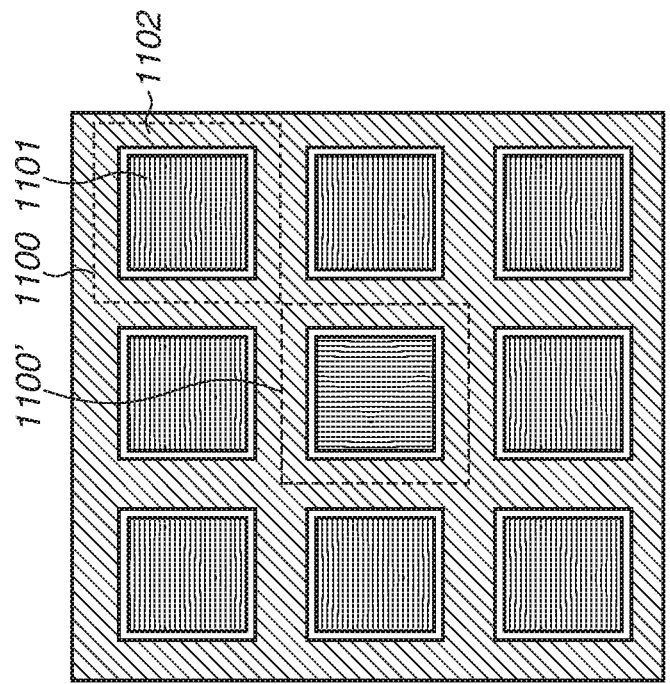
FIGS. 19A and 19B are diagrams illustrating the method for manufacturing the photoelectric conversion apparatus according to the fourth exemplary embodiment.
Figure 19A:
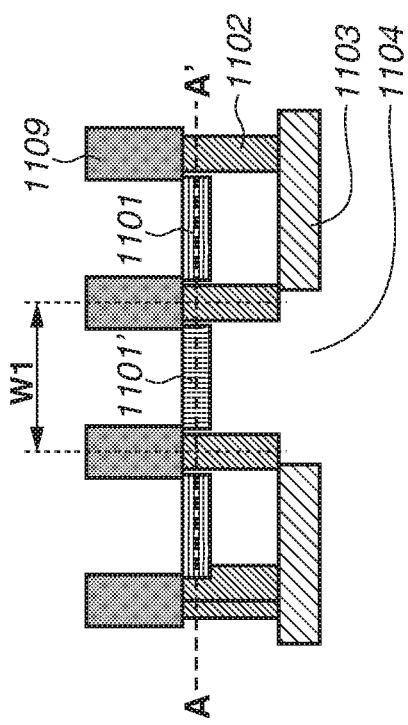

Next, a method for manufacturing the photoelectric conversion apparatus according to the fourth exemplary embodiment will be described with reference to FIGS. 16 to 19B. FIG. 16 is a flowchart illustrating the method for manufacturing the photoelectric conversion apparatus according to the present exemplary embodiment. FIGS. 17A, 18A, and 19A each illustrate a cross-sectional view of the photoelectric conversion apparatus corresponding to each process (each step) in the manufacturing method. Further, FIGS. 17B, 18B, and 19B illustrate plan views (drawings in the planar view) of cross sections along respective lines A-A' illustrated in FIGS. 17A, 18A, and 19A. When the flowchart illustrated in FIG. 16 is started, the photoelectric conversion apparatus is in such a state where the semiconductor substrate such as the N-type semiconductor substrate has been prepared. The non-isolation region 1104 corresponds to a region other than the region in which the deep isolation region 1103 is formed in the region at the depth where the deep isolation region 1103 is formed by the processing illustrated in the flowchart.

First, in step S1001 (step for forming the isolation region), the deep isolation region 1103 is formed in the semiconductor substrate as illustrated in FIGS. 17A and 17B. More specifically, for example, a resist pattern 1107, which is a pattern of a photoresist, is formed on the N-type semiconductor substrate as illustrated in FIG. 17A. Then, the deep isolation region 1103 is formed inside the N-type semiconductor substrate by implanting the p-type impurity (implanting ions) at a predetermined position from the upper portion (surface) of the N-type semiconductor substrate. After that, the resist pattern 1107 is removed. As a result, the deep isolation region 1103 is formed at the pixel 1100 that receives the visible light, but the deep isolation region 1103 is not formed at the pixel 1100' that receives the near-infrared light. At this time, the deep isolation region 1103 is formed in such a manner that the size W2 of the opening of the deep isolation region 1103 is larger than the size W1 of the pixel 1100'.

In step S1002 (step for forming pixel isolation region), the pixel isolation region 1102 is formed as illustrated in FIGS. 18A and 18B. More specifically, the pixel isolation region 1102 is formed by forming a resist pattern 1108 on the N-type semiconductor substrate and implanting the p-type impurity at a position above the deep isolation region 1103. After that, the resist pattern 1108 is removed. The pixel isolation region 1102 can also be formed by implanting the p-type impurity depth by depth through a plurality of depths. The pixel isolation region 1102 can also be formed so as to satisfy "the size W1 of the pixel 1100'<the size W3 of the opening along which the pixel isolation region 1102 surrounds the non-isolation region 1104", as in the example illustrated in the above-described drawing, FIG. 15A, by using a different resist pattern.

The trench 1106 may be formed as the pixel isolation region 1102 with use of the technique such as the deep trench isolation, as in the example described with reference to the above-described drawing, FIG. 15B.

In step S1003 (step for forming the accumulation portion), the charge accumulation portions 1101 and 1101' are formed as illustrated in FIGS. 19A and 19B. More specifically, the charge accumulation portions 1101 and 1101' are formed by forming a resist pattern 1109 on the N-type semiconductor substrate and implanting the N-type impurity at positions above the deep isolation region 1103. After that, the resist pattern 1109 is removed. At this time, the charge accumulation portions 1101 and 1101' are formed at positions surrounded by the pixel isolation region 1102. An embedded photodiode (not illustrated) may be formed by implanting a p-type impurity into the surface of the charge accumulation portion 1101 to reduce a noise component from the surface of the N-type semiconductor substrate.

The pixel isolation region 1102 and the deep isolation region 1103 are formed by implanting the p-type impurities into the N-type semiconductor substrate, and the charge accumulation portions 1101 and 1101' are formed by implanting the N-type impurity into the N-type semiconductor substrate, but the manufacturing method is not limited thereto. More specifically, the pixel isolation region 1102 and the deep isolation region 1103 may be formed by implanting N-type impurities into a p-type semiconductor substrate, and the charge accumulation portions 1101 and 1101' may be formed by implanting a p-type impurity into the p-type semiconductor substrate. In other words, similar effects to the above-described effects can be acquired even when the conductivity type of the semiconductor such as the "p-type" and the "N type" in the fourth exemplary embodiment are interchanged with each other.

The photoelectric conversion apparatus is assumed to receive the visible light at the pixel 1100 and receive the near-infrared light at the pixel 1100' in the present exemplary embodiment, but is not limited thereto. More specifically, the pixels 1100 and 1100' may be configured to receive arbitrary light as long as the light received by the pixel 1100' enters a more inner portion (has a longer entry depth) than the light received by the pixel 1100. Further, the light received by these pixels 1100 and 1100' can be determined based on the type of the above-described filter and the depth of the photoelectric conversion region 1105.

According to the present exemplary embodiment, the deep isolation region 1103 including the opening having the larger size (width) than the size (width) of the pixel that receives the near-infrared light is formed in the photoelectric conversion apparatus. As a result, the photoelectric conversion apparatus can eliminate the influence of the diffusion of the impurity from the deep isolation region 1103, thereby inhibiting the potential barrier against the signal charges (electrons) at the pixel that receives the near-infrared light.

A photoelectric conversion apparatus according to a fifth exemplary embodiment will be described with reference to FIGS. 20A and 20B. The fifth exemplary embodiment is directed to inhibiting the potential barrier at the pixel that receives the near-infrared light in the photoelectric conversion apparatus that receives the visible light and the near-infrared light, similarly to the fourth exemplary embodiment. FIG. 20A is a plan view of the photoelectric conversion apparatus, and FIG. 20B is a cross-sectional view of the photoelectric conversion apparatus in a cross section along a line A-A' illustrated in FIG. 20A. FIG. 20A is a plan view of the photoelectric conversion apparatus in a cross section along a line B-B' illustrated in FIG. 20B.

The photoelectric conversion apparatus according to the fifth exemplary embodiment will be described assigning the same reference numerals to similar configurations to the photoelectric conversion apparatus according to the fourth exemplary embodiment, and omitting detailed descriptions thereof. The photoelectric conversion apparatus according to the present exemplary embodiment includes an N-type impurity region 1110 (N-type semiconductor region) different from the deep isolation region 1103. The N-type impurity region 1110 is surrounded by the non-isolation region 1104. In this case, although it is desirable that the photoelectric conversion apparatus satisfies the relationship of the size W1 of the pixel 1100'>the size W2 of the opening of the deep isolation region 1103, the photoelectric conversion apparatus does not necessarily have to satisfy this condition.

In FIGS. 20A and 20B, the N-type impurity region 1110 is formed to be surrounded by the non-isolation region 1104 of the pixel 1100' that receives the near-infrared light. However, the N-type impurity region 1110 is not limited to be formed as the above and may also be formed in an entire pixel region also including the pixel 1100 that receives the visible light.

Due to the provision of the N-type impurity region 1110 in the photoelectric conversion apparatus in this manner, the photoelectric conversion apparatus can further inhibit (solve) the potential barrier in the non-isolation region 1104 that otherwise would be generated due to the deep isolation region 1103.

Figure 21B:
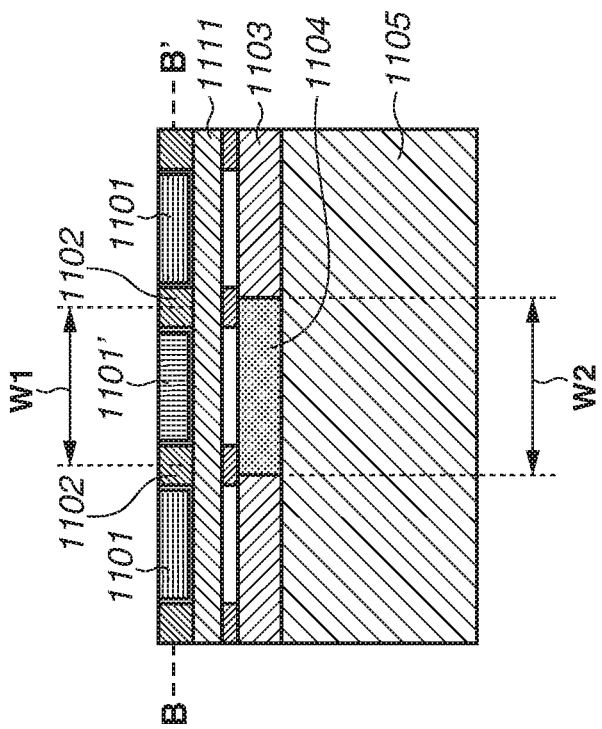
FIGS. 21A and 21B are a plan view and a cross-sectional view, respectively, of a photoelectric conversion apparatus according to a sixth exemplary embodiment.
Figure 21A:
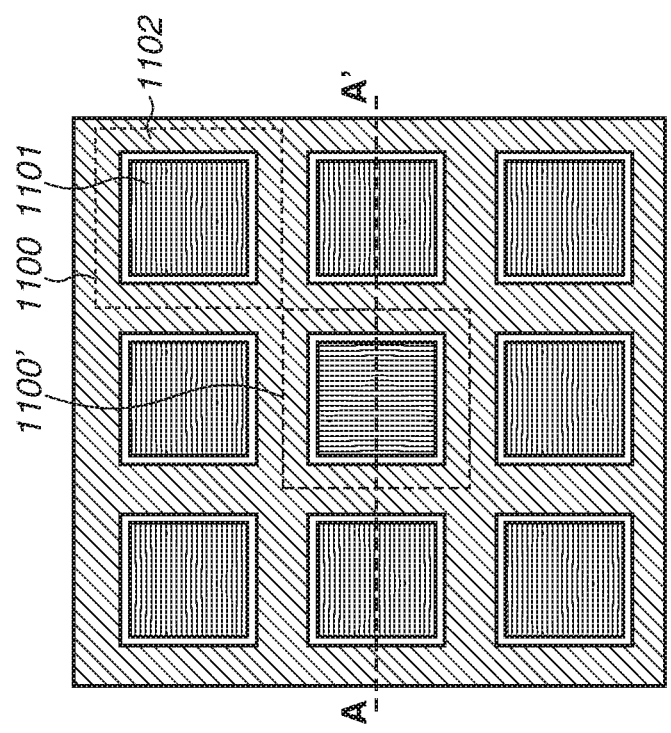

A photoelectric conversion apparatus according to a sixth exemplary embodiment will be described with reference to FIGS. 21A and 21B. The sixth exemplary embodiment is directed to inhibiting the potential barrier at the pixel that receives the near-infrared light in the photoelectric conversion apparatus that receives the visible light and the near-infrared light, similarly to the fourth exemplary embodiment. FIG. 21A is a plan view of the photoelectric conversion apparatus according to the present exemplary embodiment, and FIG. 21B is a cross-sectional view of the photoelectric conversion apparatus in a cross section along a line A-A' illustrated in FIG. 21A. Further, FIG. 21A is a plan view of the photoelectric conversion apparatus in a cross section along a line B-B' illustrated in FIG. 21B.

In the photoelectric conversion apparatus according to the fourth exemplary embodiment, a capacitor for accumulating the charges is formed due to the deep isolation region 1103 containing the p-type impurity in a large amount that is formed below the charge accumulation portion 1101 at the pixel 1100 that receives the visible light. On the other hand, the pixel 1100' that receives the near-infrared light does not include a region containing the p-type impurity in a large amount below the charge accumulation portion 1101', and therefore has a capacitor for accumulating the charges that is smaller due to lack of that region.

To address this inconvenience, in the present exemplary embodiment, a p-type impurity region 1111 containing a p-type impurity in a large amount is formed between the charge accumulation portions 1101 and 1101' and the deep isolation region 1103 and the non-isolation region 1104. With use of this configuration, the capacitors formed below the charge accumulation portions 1101 and 1101' can be increased, and these capacitors can be made equal to each other.

With use of the photoelectric conversion apparatuses described in the fourth to sixth exemplary embodiments, the potential barrier can be inhibited at the pixel that receives the near-infrared light in the photoelectric conversion apparatus that receives the visible light and the near-infrared light.

FIG. 22 illustrates a cross-sectional view of the pixel region 21 in a photoelectric conversion apparatus according to a seventh exemplary embodiment. The photoelectric conversion apparatus according to the present exemplary embodiment is different from the photoelectric conversion apparatus according to the first exemplary embodiment in that the photoelectric conversion apparatus includes a region in which the impurity concentration of the p-type semiconductor region 203 increases from the upper surface to the lower surface of the substrate 100. In FIG. 22, a profile of the impurity concentration along a broken line in FIG. 22 is indicated. In the description below, the seventh exemplary embodiment will be described by omitting descriptions of configurations similar to the photoelectric conversion apparatus 10 according to the first exemplary embodiment.

The substrate 100 according to the present exemplary embodiment can be made by, for example, the following method. First, a p-type semiconductor region is formed on an upper surface of a p-type silicon substrate by the epitaxial growth method. In FIG. 22, the p-type silicon substrate corresponds to a portion between a line indicating the lower surface of the substrate 100 and a long dashed dotted line, and the p-type semiconductor region formed by the epitaxial growth method corresponds to a portion between the long dashed dotted line and a short dashed dotted line. The p-type semiconductor region formed by the epitaxial growth method includes a first portion and a second portion having a higher doped impurity concentration than the first portion. The second portion is disposed farther away from a surface of the substrate 100 on the filter side than the first portion is. The p-type semiconductor region formed by the epitaxial growth method is grown in such a manner that the impurity concentration gradually reduces. Next, p-type impurity ions are implanted and N-type impurity ions are implanted after that into an N-type semiconductor region formed by the epitaxial growth method. In FIG. 22, the region into which the p-type impurity ions and the N-type impurity ions are implanted corresponds to a portion between the short dashed dotted line and a line indicating the upper surface of the substrate 100. When the p-type impurity ions are implanted into the N-type semiconductor region, the p-type impurity ions are implanted so as not to generate a potential barrier at a junction surface between the p-type semiconductor region formed by the epitaxial growth method and the N-type semiconductor region formed by the epitaxial growth method. The impurity ions are implanted in such a manner that the impurity concentration reduces toward the upper surface of the substrate 100. As a result, the photoelectric conversion apparatus can collect even charges generated at a position away from the upper surface of the substrate 100, thereby improving the sensitivity to the IR light.

In FIG. 22, p-type impurity ions are further implanted after the N-type impurity ions are implanted. Due to this method, the photoelectric conversion apparatus can inhibit the dark current that otherwise would be generated near the upper surface of the substrate 100.

A thickness of the p-type semiconductor region formed by the epitaxial growth method falls within, for example, a range of 1 µm or thicker and 50 µm or thinner, and a thickness of the N-type semiconductor region formed by the epitaxial growth method falls within, for example, a range of 1 µm or thicker and 5 µm or thinner.

Figure 23:
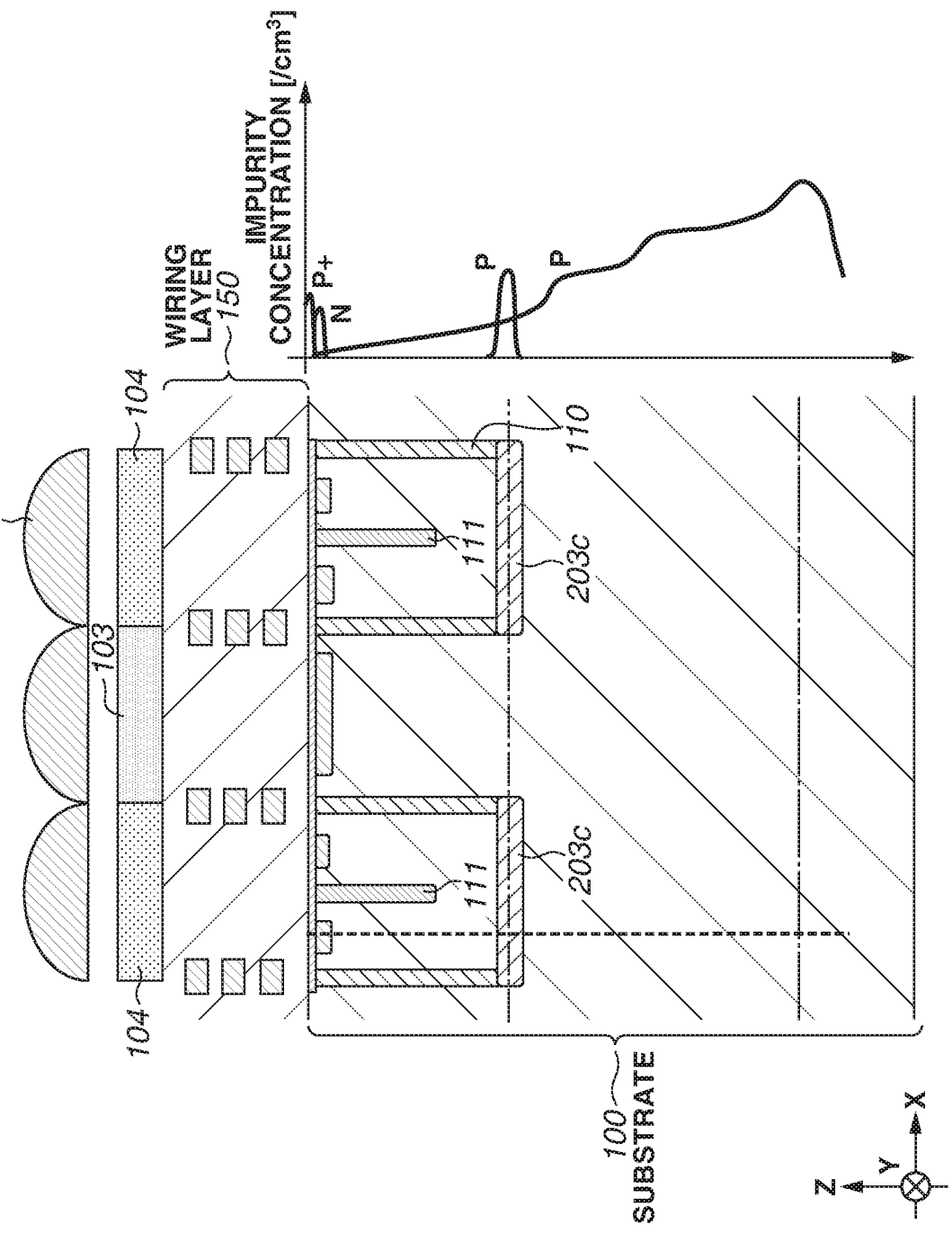
FIG. 23 is a cross-sectional view of a part of a pixel region according to an eighth exemplary embodiment.

FIG. 23 illustrates a cross-sectional view of the pixel region 21 in a photoelectric conversion apparatus according to an eighth exemplary embodiment. The photoelectric conversion apparatus according to the present exemplary embodiment is different from the photoelectric conversion apparatus according to the second exemplary embodiment in that the photoelectric conversion apparatus includes a region in which the impurity concentration of the p-type semiconductor region 203 increases from the upper surface toward the lower surface of the substrate 100. In FIG. 23, a profile of the impurity concentration along a broken line in FIG. 23 is illustrated.

The method for manufacturing the substrate 100 according to the present exemplary embodiment is similar to the method for manufacturing the substrate 100 according to the seventh exemplary embodiment except that p-type ions are implanted into the region corresponding to the p-type semiconductor region 203c, and therefore a description thereof will be omitted herein.

Figure 24:
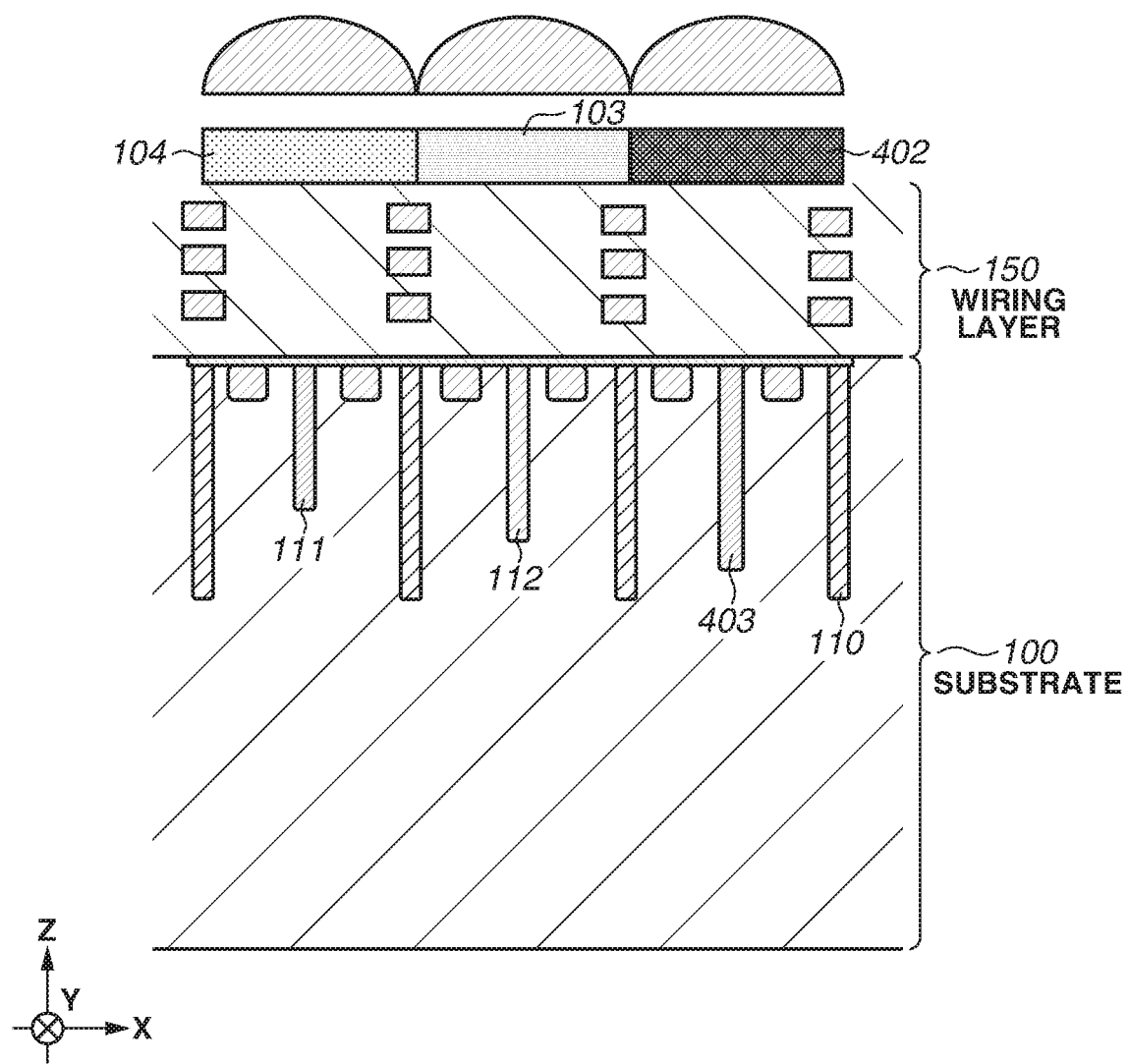
FIG. 24 is a cross-sectional view of a part of a pixel region according to a ninth exemplary embodiment.

FIG. 24 illustrates a cross-sectional view of a photoelectric conversion apparatus according to a ninth exemplary embodiment. The photoelectric conversion apparatus according to the present exemplary embodiment is different from the photoelectric conversion apparatus according to the first exemplary embodiment in that the photoelectric conversion apparatus includes a color filter 402 that permits transmission of light at a wavelength on a longer wavelength side than the light at the wavelength transmissive through the color filter 103. In the descriptions below, the ninth exemplary embodiment will be described by omitting descriptions of configurations similar to the photoelectric conversion apparatus 10 according to the first exemplary embodiment.

In the present exemplary embodiment, for example, the color filter 103 is a filter on which the transmissive peak wavelength is 650 nm≤wavelength $\lambda$<700 nm, and the color filter 402 is a filter on which the transmissive peak wavelength is wavelength $\lambda$≥700 nm. A depth of a p-type semiconductor region 403, which is disposed between a plurality of photoelectric conversion portions, is deeper than the depth of the p-type semiconductor region 112 and shallower than the p-type semiconductor region 110 in a region overlapping the color filter 402 in the planar view. Due to this configuration, the photoelectric conversion apparatus can prevent a leak of charges to an adjacent pixel while isolating the charges between the plurality of photoelectric conversion portions that photoelectrically converts the light transmitted through the color filter 402.

Figure 25:
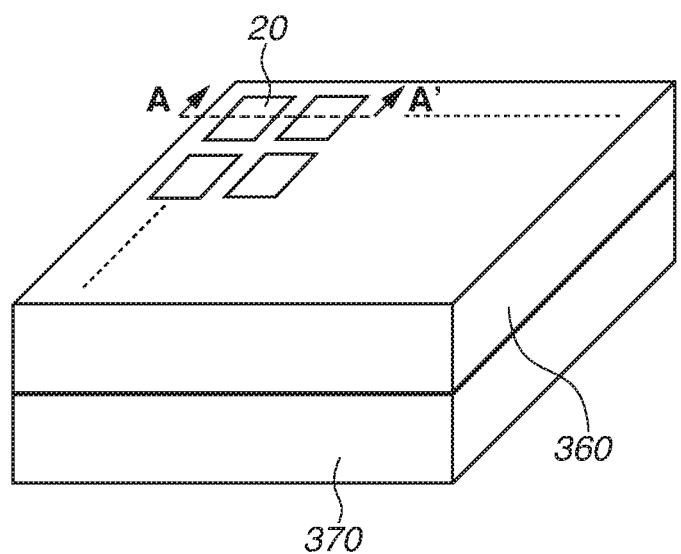
FIG. 25 is a perspective view schematically illustrating a photoelectric conversion apparatus according to a tenth exemplary embodiment.
Figure 26:
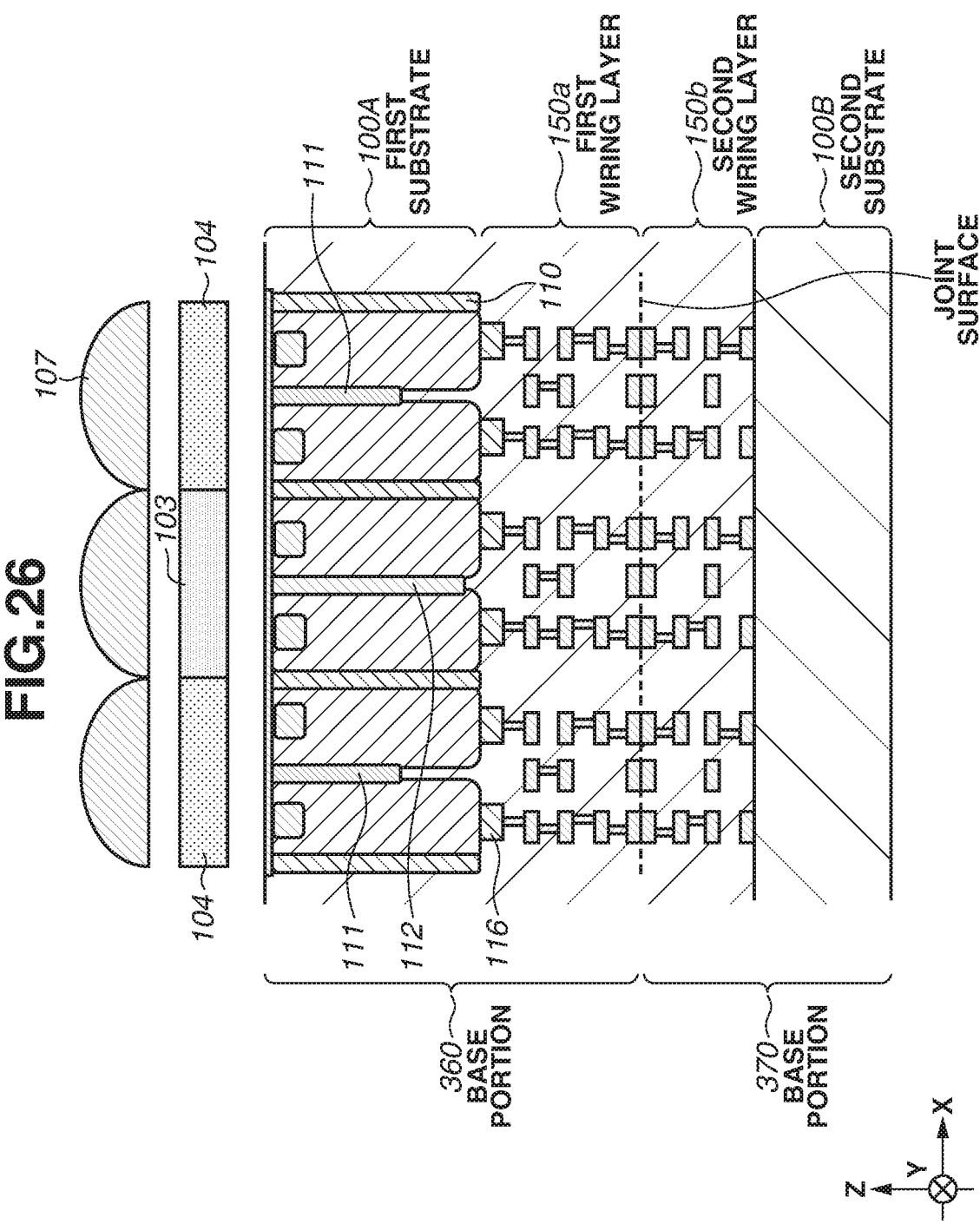
FIG. 26 is a cross-sectional view taken along a line A-A' illustrated in FIG. 25.

FIG. 25 illustrates a view schematically illustrating a photoelectric conversion apparatus according to a tenth exemplary embodiment, and FIG. 26 is a cross-sectional view taken along a line A-A' illustrated in FIG. 25. The photoelectric conversion apparatus according to the present exemplary embodiment is different from the photoelectric conversion apparatus according to the first exemplary embodiment in that the photoelectric conversion apparatus is constructed by stacking a base portion 360 including a photoelectric conversion portion and a base portion 370 including at least a partial circuit of the peripheral circuit region. The photoelectric conversion apparatus illustrated in FIGS. 25 and 26 is a so-called back-side illuminated photoelectric conversion apparatus in which a semiconductor substrate 100A including the photoelectric conversion portion is disposed between a wiring layer and the micro lens 107. The sensitivity can be improved by configuring the photoelectric conversion apparatus as the back-side illuminated photoelectric conversion apparatus.

As illustrated in FIG. 26, gate electrodes of transistors such as a transfer transistor, a source follower transistor, and a reset transistor, and a metallic wiring layer are disposed on a lower surface of the first semiconductor substrate 100A including the photoelectric conversion portion. Each of the gate electrodes of the transistors is connected to the wiring layer via a plug. The plug can be integrally formed with use of tungsten as a main material thereof. The plug and a wiring included in the wiring layers 150a and 150b can be integrally formed by the dual damascene method with use of copper as a main material thereof.

The base portion 360 includes the first semiconductor substrate 100A and a first wiring layer 150a, and the base portion 370 includes a second semiconductor substrate 100B and a second wiring layer 150b. The base portion 360 and the base portion 370 are glued to each other on a joint surface. The joint surface is made from metal such as copper and an insulator such as an oxide film. The metal constituting the joint surface may also constitute a wiring that connects elements disposed on the first semiconductor substrate 100A, such as the photoelectric conversion portions 106a and 106b, and the readout circuit 23 disposed on the second semiconductor substrate 100B to each other.

Figure 27:
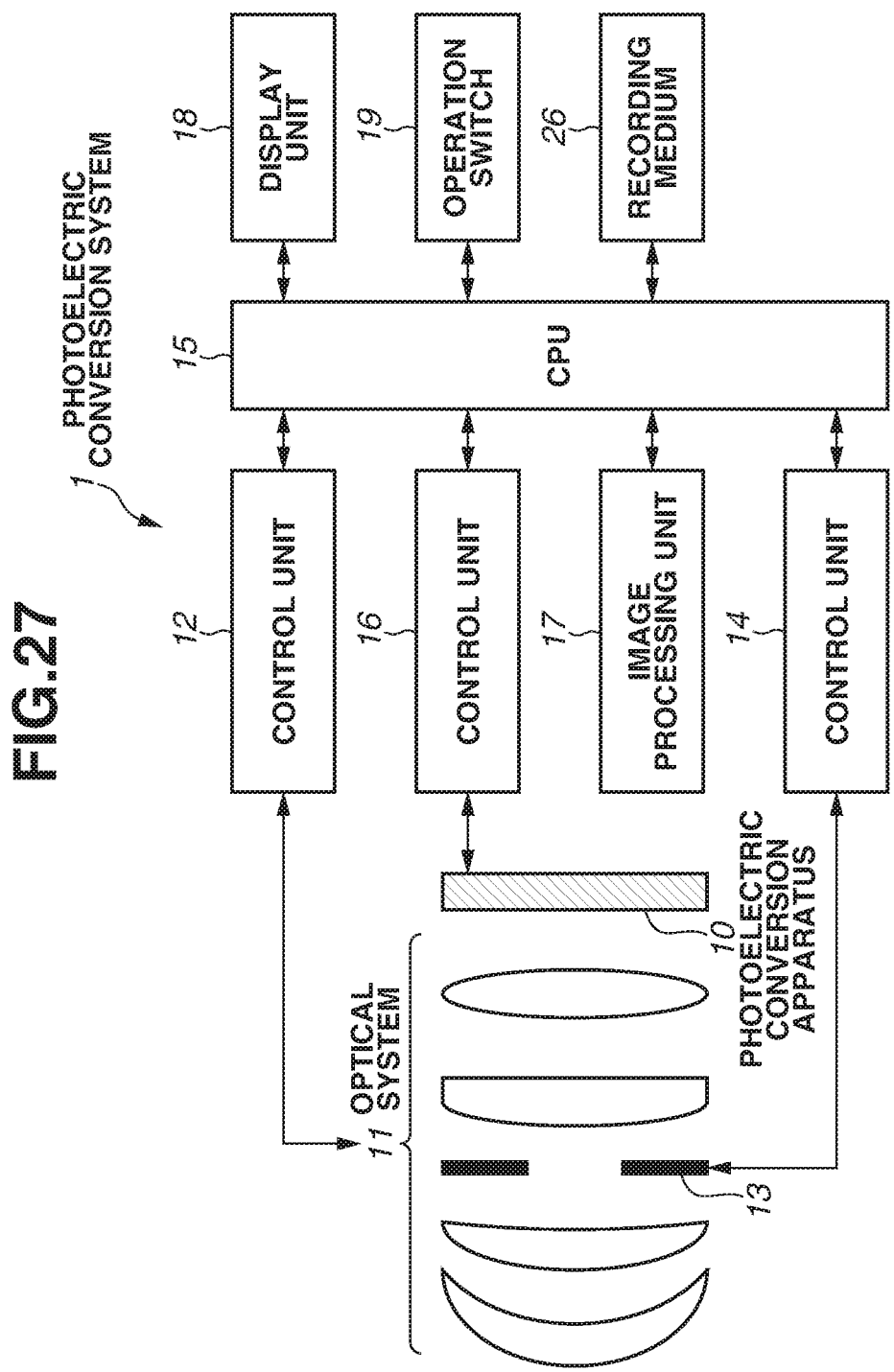
FIG. 27 is a block diagram schematically illustrating a photoelectric conversion system according to an eleventh exemplary embodiment.

A photoelectric conversion system according to an eleventh exemplary embodiment will be described with reference to FIG. 27. The present exemplary embodiment will be described by assigning the same reference numerals to similar configurations to the photoelectric conversion apparatus according to each of the above-described exemplary embodiments and omitting or simplifying descriptions thereof. FIG. 27 is a block diagram schematically illustrating a configuration of the photoelectric conversion system according to the present exemplary embodiment.

The photoelectric conversion apparatus described in each of the above-described exemplary embodiments is applicable to various photoelectric conversion systems as a photoelectric conversion apparatus illustrated in FIG. 27. Examples of the photoelectric conversion system to which the photoelectric conversion apparatus is applicable include a digital still camera, a digital camcorder, a monitoring camera, a copying machine, a facsimile machine, a mobile phone, an in-vehicle camera, and an observatory satellite. Further, the examples of the photoelectric conversion system also include a camera module including an optical system such as a lens and a photoelectric conversion apparatus. FIG. 27 exemplifies a block diagram of the digital still camera as one example of them.

A lens as an optical system 11 that forms a subject image is mounted on a photoelectric conversion system 1 exemplified in FIG. 27. A focus position of the optical system 11 including the lens is controlled by a control unit 12. The photoelectric conversion system 1 includes a diaphragm 13 for making an amount of light passing through the lens variable, and a control unit 14 having a diaphragm function that adjusts the light amount by changing an aperture diameter of the diaphragm 13 (i.e., by making an aperture value variable). An imaging plane of the photoelectric conversion apparatus 10 that photoelectrically converts the subject image formed by the optical system 11 is disposed in an image space of the optical system 11. The photoelectric conversion apparatus 10 is the photoelectric conversion apparatus described in any of the first to tenth exemplary embodiments, and converts an optical image formed by the lens into image data.

A central processing unit (CPU) 15 is a processor, a device, or a controller in charge of control of various operations of the camera. The CPU 15 includes an arithmetic unit, a read only memory (ROM), a random access memory (RAM), an analog (A)/digital (D) converter, a D/A converter, a communication interface circuit, and the like. The CPU 15 controls an operation of each unit in the camera based on a computer program stored in the ROM, and causes it to perform a series of imaging operations such as automatic focus (AF) including detection of a focus state of the optical system 11 (focus detection), imaging, image processing, and recording. The CPU 15 may correspond to an arithmetic device.

A control unit 16 controls the operation of the photoelectric conversion apparatus 10, and also carries out an A/D conversion on the pixel signal (imaging signal) output from the photoelectric conversion apparatus 10 and transmits it to the CPU 15. The photoelectric conversion apparatus 10 may have the A/D conversion function. An image processing unit 17 generates an image signal by performing image processing such as a γ-conversion and color interpolation on the imaging signal converted by the A/D conversion. A display unit 18 is a display unit such as a liquid crystal display (LCD), and displays information about an imaging mode of the camera, a preview image before the imaging, an image for confirmation after the imaging, an in-focus state at the time of the focus detection, and the like. An operation switch 19 includes a power switch, a release (imaging trigger) switch, a zoom operation switch, an imaging mode selection switch, and the like. A recording medium 26 records an already captured image. The recording medium 26 may be an attachable and detachable recording medium such as a memory card, or may be built in the photoelectric conversion system 1.

The camera CPU 15 selects an output value of the pixel in an optimum form among a plurality of types of light blocking forms depending on the mounted lens and further on an imaging condition, and carries out the focus detection. As a result, the photoelectric conversion system 1 can provide a camera system that achieves high focus detection accuracy for various lenses. For example, the photoelectric conversion system 1 can improve the focus detection accuracy with respect to the infrared light by using a lens that has a high transmittance of the infrared light.

A photoelectric conversion system and a movable object according to a twelfth exemplary embodiment will be described with reference to FIGS. 28A and 28B.

Figure 28A:
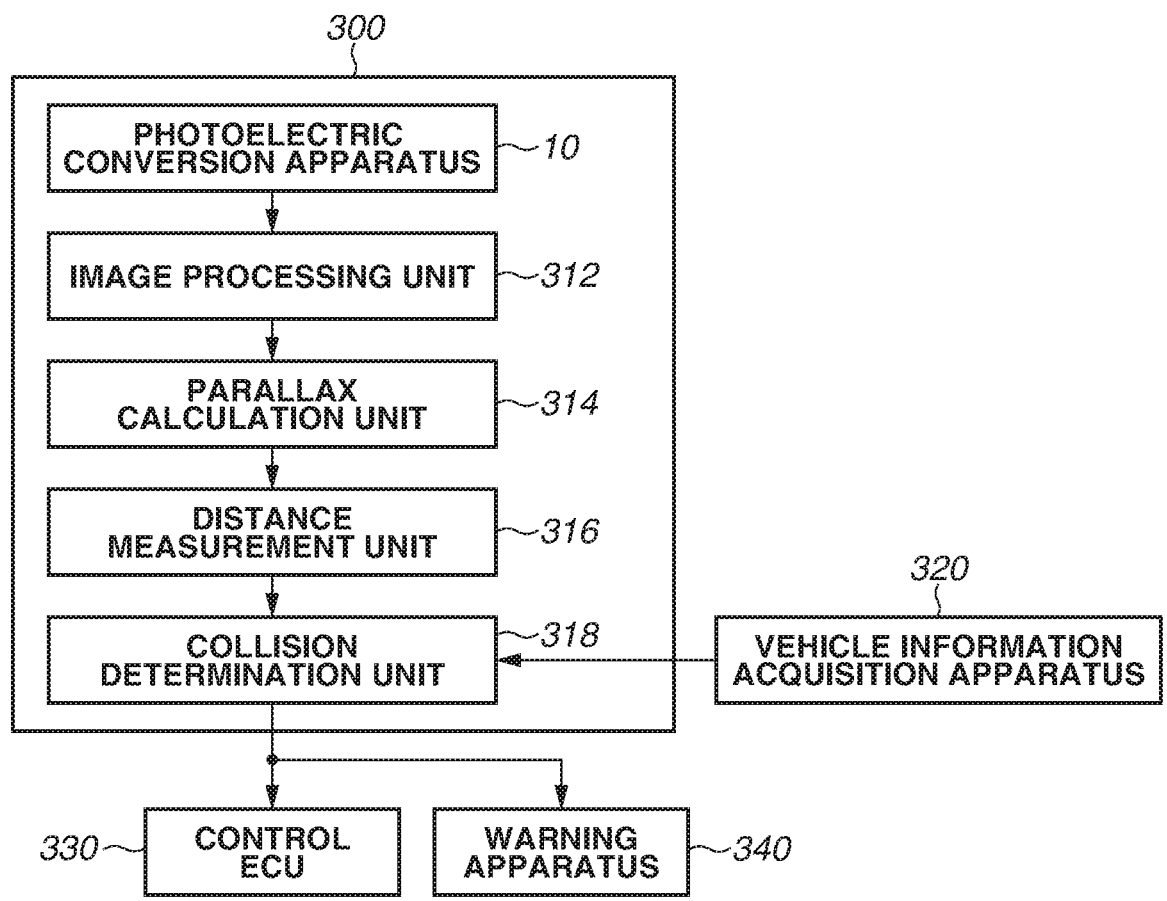
FIGS. 28A and 28B are diagrams schematically illustrating a movable object according to a twelfth exemplary embodiment.
Figure 28B:
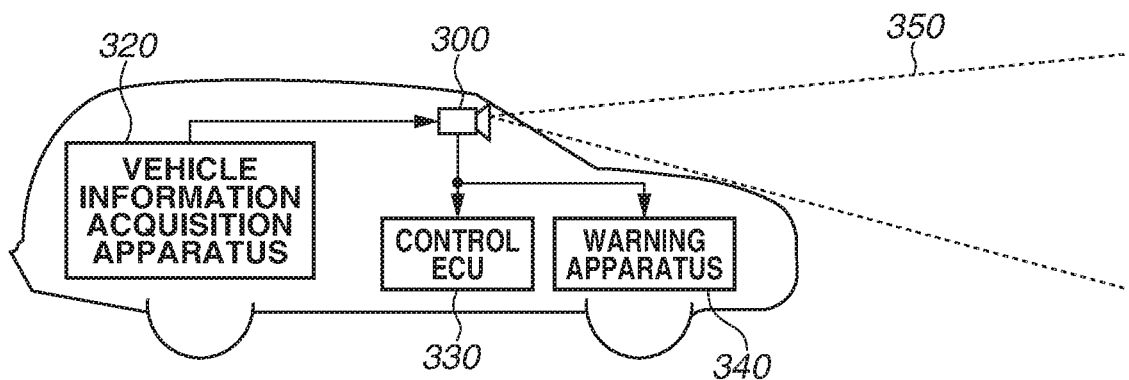

FIG. 28A illustrates one example of the photoelectric conversion system related to the in-vehicle camera. A photoelectric conversion system 300 includes the photoelectric conversion apparatus 10. The photoelectric conversion apparatus 10 is the photoelectric conversion apparatus described in any of the above-described first to tenth exemplary embodiments. The photoelectric conversion system 300 includes an image processing unit 312 that performs image processing on a plurality of pieces of image data acquired by the photoelectric conversion apparatus 10, and a parallax calculation unit 314 that calculates a parallax (phase difference between parallax images) based on the plurality of pieces of image data acquired by the photoelectric conversion system 300. The photoelectric conversion system 300 also includes a distance measurement unit 316 that calculates a distance to a target based on the calculated parallax, and a collision determination unit 318 that determines whether there is a collision possibility based on the calculated distance. Herein, the parallax calculation unit 314 and the distance measurement unit 316 are examples of a distance information acquisition unit that acquires distance information to the target. More specifically, the distance information refers to information about a parallax, a defocus amount, a distance to the target, and the like. The collision determination unit 318 can determine the collision possibility with use of any of these pieces of distance information. The distance information acquisition unit may be implemented by hardware designed specially therefor or may be implemented by a software module. A processing apparatus may be implemented by a field programmable gate array (FPGA), an application specific integrated circuit (ASIC), or the like. The processing apparatus may also be implemented by a combination of them.

The photoelectric conversion system 300 is connected to a vehicle information acquisition apparatus 320, and can acquire vehicle information such as a vehicle speed, a yaw rate, and a steering angle. The photoelectric conversion system 300 is also connected to a control electronic control unit (ECU) 330, which is a control apparatus that outputs a control signal for generating a braking force on the vehicle based on a result of the determination by the collision determination unit 318. The photoelectric conversion system 300 is also connected to a warning apparatus 340 that issues a warning to a driver based on the result of the determination by the collision determination unit 318. For example, when the collision possibility is high as the result of the determination by the collision determination unit 318, the control ECU 330 controls the vehicle to avoid a collision or reduce damage by, for example, braking the vehicle, releasing an accelerator, and/or reducing an engine output. The warning apparatus 340 warns the user by, for example, emitting a warning such as a sound, displaying warning information on a screen of a car navigation system or the like, and/or vibrating a seat belt or a steering handle.

In the present exemplary embodiment, surroundings of the vehicle, such as scenery in front of or behind the vehicle, are imaged by the photoelectric conversion system 300. FIG. 28B illustrates the photoelectric conversion system 300 in a case where the photoelectric conversion system 300 images the scenery in front of the vehicle (i.e., imaging range 350). The vehicle information acquisition apparatus 320 transmits an instruction to the photoelectric conversion system 300 or the photoelectric conversion apparatus 10 to cause it to perform a predetermined operation. With such a configuration, the distance can be measured with further improved accuracy.

In the above description, the photoelectric conversion system 300 has been described by referring to the example that performs control to prevent the vehicle from colliding with another vehicle, but is also applicable to control for automatically driving the vehicle to follow the other vehicle, and control for automatically driving the vehicle to prevent the vehicle from departing from a traffic lane, and the like. Further, the photoelectric conversion system 300 is applicable to not only the vehicle such as the vehicle on which the photoelectric conversion system 300 is mounted but also a movable object (movable apparatus) such as a ship, an airplane, or an industrial robot. In addition, the photoelectric conversion system 300 is widely applicable to not only the movable object but also an apparatus using object recognition, such as an intelligent transportation system (ITS).

MODIFIED EXEMPLARY EMBODIMENTS

The disclosure is not limited to the above-described exemplary embodiments and can be modified in various manners. For example, exemplary embodiments of the disclosure also include an example in which a part of the configuration of any of the exemplary embodiments is added to another exemplary embodiment or is replaced with a part of the configuration of another exemplary embodiment.

Any of the above-described exemplary embodiments merely indicates an example of how to embody the disclosure when implementing the disclosure, and the technical scope of the disclosure shall not be construed limitedly by them. In other words, the disclosure can be implemented in various manners without departing from the technical idea thereof or the main features thereof.

According to the disclosure, it is possible to improve the characteristic of the photoelectric conversion apparatus including the filter permitting the transmission of the IR light therethrough and the filter permitting the transmission of the visible light therethrough.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Applications No. 2018-197687, filed Oct. 19, 2018, and No. 2018-236156, filed Dec. 18, 2018, which are hereby incorporated by reference herein in their entirety.

What is claimed is:

1. A photoelectric conversion apparatus comprising:
   a semiconductor substrate including a plurality of photoelectric conversion portions;
   first and second micro lenses;
   a first filter on which a transmittance of infrared light is higher than a transmittance of visible light; and
   a second filter on which the transmittance of the visible light is higher than the transmittance of the infrared light,
   wherein the plurality of photoelectric conversion portions includes
   at least one photoelectric conversion portion disposed so as to overlap the first micro lens and the first filter in a planar view, and
   a plurality of photoelectric conversion portions disposed so as to overlap the second micro lens and the second filter in the planar view,
   wherein the at least one photoelectric conversion portion disposed so as to overlap the first filter in the planar view and the plurality of photoelectric conversion portions disposed so as to overlap the second filter in the planar view each include
   a first semiconductor region having a first conductivity type in which a signal charge is accumulated, and
   a second semiconductor region having a second conductivity type, which is an opposite conductivity type of the first conductivity type, the second semiconductor region being disposed on an opposite side of a side of the first filter of the first semiconductor region and disposed so as to overlap the first semiconductor region in the planar view, the second semiconductor region forming a p-n junction together with the first semiconductor region, and
   wherein an impurity concentration of at least a part of the second semiconductor region of the at least one photoelectric conversion portion is lower than an impurity concentration of a portion in the second semiconductor regions of the plurality of photoelectric conversion portions that is disposed at the same depth as the at least a part of the second semiconductor region.

2. The photoelectric conversion apparatus according to claim 1, wherein one photoelectric conversion portion is disposed so as to overlap the first micro lens in the planar view.

3. The photoelectric conversion apparatus according to claim 1, wherein a plurality of photoelectric conversion portions is disposed so as to overlap the first micro lens in the planar view.

4. The photoelectric conversion apparatus according to claim 1, wherein the at least a part of the second semiconductor region is located at a position separated from a surface of the semiconductor substrate on the first filter side by 2.0 µm or more.

5. The photoelectric conversion apparatus according to claim 1, wherein the second semiconductor region includes a first portion and a second portion, at a position separated farther away from the surface of the semiconductor region on the first filter side than the at least a part of the second semiconductor region is, the second portion being disposed at a position separated farther away from the surface of the semiconductor substrate on the first filter side than the first portion, the second portion having a higher doped impurity concentration than impurity concentration of the first portion.

6. The photoelectric conversion apparatus according to claim 1, wherein the second semiconductor region contained in each of the plurality of photoelectric conversion portions disposed so as to overlap the second filter in the planar view includes a third portion, and a fourth portion located on an opposite side of a first semiconductor region side of the third portion, the fourth portion having a higher doped impurity concentration than the third portion, and
wherein a doped impurity concentration of the at least a part of the second semiconductor region is lower than the doped impurity concentration of the fourth portion at the same depth as the fourth portion.

7. The photoelectric conversion apparatus according to claim 6, wherein the third portion includes a portion in which an impurity concentration reduces as the third portion approaches a surface of the semiconductor substrate on a second filter side.

8. The photoelectric conversion apparatus according to claim 1, wherein the second semiconductor region includes a portion formed by an epitaxial growth method and a portion formed by implanting impurity ions.

9. A photoelectric conversion apparatus comprising:
a semiconductor substrate including a plurality of photoelectric conversion portions;
first and second filters on which a transmittance of infrared light is higher than a transmittance of visible light; and
third and fourth filters on which the transmittance of the visible light is higher than the transmittance of the infrared light,
wherein a photoelectric conversion portion disposed so as to overlap the first filter in a planar view, a photoelectric conversion portion disposed so as to overlap the second filter in the planar view, a photoelectric conversion portion disposed so as to overlap the third filter in the planar view, and a photoelectric conversion portion disposed so as to overlap the fourth filter in the planar view are arranged adjacently to one another in one direction,
wherein the photoelectric conversion portion disposed so as to overlap the first filter in the planar view includes a first semiconductor region having a first conductivity type in which a signal charge is accumulated,
wherein the photoelectric conversion portion disposed so as to overlap the second filter in the planar view includes a second semiconductor region having the first conductivity type,
wherein the photoelectric conversion portion disposed so as to overlap the third filter in the planar view includes a third semiconductor region having the first conductivity type,
wherein the photoelectric conversion portion disposed so as to overlap the fourth filter in the planar view includes a fourth semiconductor region having the first conductivity type,
wherein a fifth semiconductor region having a second conductivity type, which is an opposite conductivity type of the first conductivity type, is disposed between the second semiconductor region and the third semiconductor region,
wherein a sixth semiconductor region having the second conductivity type is disposed between the first semiconductor region and the second semiconductor region,
wherein a seventh semiconductor region having the second conductivity type is disposed between the third semiconductor region and the fourth semiconductor region,
wherein each of the fifth semiconductor region, the sixth semiconductor region, and the seventh semiconductor region includes at least one peak of an impurity concentration,
wherein a position of a peak separated farthest away from a surface of the semiconductor substrate on a first filter side, among peaks that the sixth semiconductor region has, is separated farther away from the surface of the semiconductor substrate on the first filter side than a position of a peak separated farthest away from the surface of the semiconductor substrate on the first filter side, among peaks that the seventh semiconductor region has, and
wherein a position of a peak separated farthest away from the surface of the semiconductor substrate on the first filter side, among peaks that the fifth semiconductor region has, is separated farther away from the surface of the semiconductor substrate on the first filter side than the position of the peak separated farthest away from the surface of the semiconductor substrate on the first filter side, among the peaks that the sixth semiconductor region has.

10. The photoelectric conversion apparatus according to claim 9, wherein the position of the peak of the impurity concentration of the sixth semiconductor region that is separated farthest away from the surface of the semiconductor region on the first filter side is 2.0 µm or less.

11. The photoelectric conversion apparatus according to claim 9,
wherein a first photoelectric conversion portion of the plurality of photoelectric conversion portions and a second photoelectric conversion portion of the plurality of photoelectric conversion portions share a first micro lens, and
wherein a third photoelectric conversion portion of the plurality of photoelectric conversion portions and a fourth photoelectric conversion portion of the plurality of photoelectric conversion portions share a second micro lens.

12. A photoelectric conversion apparatus comprising:
a first filter on which a transmittance of infrared light is higher than a transmittance of visible light;
a second filter on which the transmittance of the visible light is higher than the transmittance of the infrared light;
a first charge accumulation portion formed below the second filter, the first charge accumulation portion being a semiconductor region having a first conductivity type;

a second charge accumulation portion formed below the first filter, the second charge accumulation portion being a semiconductor region having the first conductivity type;

an isolation region formed below the first charge accumulation portion, the isolation region being formed of a semiconductor region having a second conductivity type, which is a different conductivity type from the first conductivity type; and a non-isolation region formed below the second charge accumulation portion, the non-isolation region being formed of a semiconductor region having a lower potential for a charge than that of the isolation region, wherein the isolation region and the non-isolation region are provided at the same height, wherein the non-isolation region is surrounded by the isolation region in a planar view, and wherein a size of an opening of the isolation region surrounding the non-isolation region is larger than a size of a pixel including the second charge accumulation portion in the planar view.

13. The photoelectric conversion apparatus according to claim 12, wherein the size of the opening of the isolation region is the size of the non-isolation region.

14. The photoelectric conversion apparatus according to claim 12, wherein a photoelectric conversion region that photoelectrically converts the light is further formed below the non-isolation region, and wherein the second charge accumulation portion accumulates a charge photoelectrically converted by the photoelectric conversion region.

15. The photoelectric conversion apparatus according to claim 12, wherein a semiconductor region having the first conductivity type that is surrounded by the non-isolation region in the planar view is further formed.

16. The photoelectric conversion apparatus according to claim 12, wherein a pixel including the first charge accumulation portion and the pixel including the second charge accumulation portion each further include a pixel isolation region that surrounds the first charge accumulation portion or the second charge accumulation portion in the planar view, and isolates adjacent pixels.

17. The photoelectric conversion apparatus according to claim 16, wherein a part of the non-isolation region is surrounded by the pixel isolation region in the planar view, and wherein a size of an opening along which the pixel isolation region surrounds the non-isolation region is larger than the size of the pixel including the second charge accumulation portion in the planar view.

18. The photoelectric conversion apparatus according to claim 12, wherein a region forming a capacitor for accumulating the charge is formed between the first charge accumulation portion and the isolation region, and between the second charge accumulation portion and the non-isolation region.

19. A photoelectric conversion system comprising:

the photoelectric conversion apparatus according to claim 1; and a signal processing unit configured to process a signal output from the photoelectric conversion apparatus.

20. A movable object comprising:

the photoelectric conversion apparatus according to claim 1;

a movable apparatus;

a processing apparatus configured to acquire information from a signal output from the photoelectric conversion apparatus; and a control apparatus configured to control the movable apparatus based on the information.

* * * * *